US012701850B2

(12) United States Patent
Chen et al.

(10) Patent No.: US 12,701,850 B2
(45) Date of Patent: Aug. 4, 2026

(54) LIGHT-EMITTING ELECTRONIC DEVICE AND LIGHT-EMITTING PANEL

(71) Applicant: AUO Corporation, Hsin-Chu (TW)

(72) Inventors: Yi-Hong Chen, Hsin-Chu (TW); Yu-Hsin Huang, Hsin-Chu (TW); Chia-An Lee, Hsin-Chu (TW); Yin-Yu Chen, Hsin-Chu (TW); Kuan-Heng Lin, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 423 days.

(21) Appl. No.: 18/506,160

(22) Filed: Nov. 10, 2023

(65) Prior Publication Data

US 2025/0160089 A1     May 15, 2025

(30) Foreign Application Priority Data

Apr. 10, 2023    (TW) ................................. 112113334

(51) Int. Cl.
 *H10H 29/14* (2025.01)
 *H10D 30/47* (2025.01)
 *H10D 62/10* (2025.01)
(52) U.S. Cl.
 CPC .......... *H10H 29/142* (2025.01); *H10D 30/47* (2025.01); *H10D 62/124* (2025.01)
(58) Field of Classification Search
 CPC ........ G09F 9/33; H10D 30/47; H10D 30/475; H10D 62/124; H10D 62/8503;
(Continued)

(56) References Cited

U.S. PATENT DOCUMENTS

| 2010/0019279 A1 | 1/2010 | Chen et al. | |
| 2011/0233564 A1* | 9/2011 | Shen ...................... | H10H 29/14 |
| | | | 438/22 |

(Continued)

FOREIGN PATENT DOCUMENTS

| CN | 103730480 A | 4/2014 |
| CN | 204477773 U | 7/2015 |
(Continued)

*Primary Examiner* — Nelson Garces
(74) *Attorney, Agent, or Firm* — WPAT PC

(57) ABSTRACT

A light-emitting electronic device includes a first electronic component, a second electronic component, an insulating layer, a conductive layer, an anchor structure, and a tether. The first electronic component and the second electronic component respectively include semiconductor layers vertically stacked together, a first electrode, and a second electrode. The insulating layer extends along lower surfaces and sidewalls of the first electronic component and the second electronic component. The conductive layer is at least partially disposed in the insulating layer and is electrically connected to the second electrode of the first electronic component and the first electrode of the second electronic component. The anchor structure is laterally separated from the first electronic component and the second electronic component. The anchor structure includes semiconductor layers vertically stacked together. The tether is connected to the first electronic component, the second electronic component, and the anchor structure.

10 Claims, 40 Drawing Sheets

(58) Field of Classification Search
CPC .... H10H 29/10; H10H 29/142; H10H 29/842; H10H 29/857; H10W 70/611; H10W 70/65; H10W 90/00
See application file for complete search history.

(56) References Cited

U.S. PATENT DOCUMENTS

| | | | | |
|---|---|---|---|---|
| 2013/0214693 | A1* | 8/2013 | Huang | ................ H05B 45/395 |
| | | | | 315/297 |
| 2015/0333241 | A1 | 11/2015 | Chen et al. | |
| 2016/0197239 | A1 | 7/2016 | Kuo et al. | |
| 2017/0069682 | A1 | 3/2017 | Chen et al. | |
| 2017/0338278 | A1 | 11/2017 | Chen et al. | |
| 2017/0338810 | A1 | 11/2017 | Chen et al. | |
| 2018/0331154 | A1 | 11/2018 | Chen et al. | |
| 2020/0119086 | A1 | 4/2020 | Chen et al. | |
| 2021/0020690 | A1 | 1/2021 | Chen et al. | |
| 2021/0091279 | A1* | 3/2021 | Kong | ................... H10H 20/857 |
| 2021/0104622 | A1* | 4/2021 | Park | ................... H10D 30/475 |
| 2021/0305239 | A1* | 9/2021 | Carlson | ................ H10D 84/811 |
| 2021/0336078 | A1* | 10/2021 | Fan | ...................... H10H 20/813 |
| 2021/0367119 | A1 | 11/2021 | Chen et al. | |
| 2022/0262849 | A1 | 8/2022 | Chen et al. | |
| 2024/0170462 | A1* | 5/2024 | Li | ........................ H10H 20/857 |

FOREIGN PATENT DOCUMENTS

| | | | |
|---|---|---|---|
| CN | 205065427 | U | 3/2016 |
| CN | 105990390 | A * | 10/2016 |
| CN | 107859906 | A | 3/2018 |
| CN | 111402821 | A | 7/2020 |
| TW | 201001669 | A | 1/2010 |
| TW | 201545385 | A | 12/2015 |
| TW | 201626603 | A | 7/2016 |
| TW | 201637236 | A | 10/2016 |

* cited by examiner

30

310 — provide a semiconductor stacked structure on a substrate

320 — etch to form trenches in the semiconductor stacked structure

330 — form an insulating layer and electrodes

340 — form a conductive layer and other electrode(s)

350 — form another insulating layer and metal contacts

360 — form a sacrificial layer and a bonding layer to bond the semiconductor stacked structure to a carrier 370 — flip the semiconductor stacked structure upside down and thin down the semiconductor stacked structure 380 — remove the sacrificial layer 390 — strip the semiconductor stacked structure from its anchor structure, transfer the semiconductor stacked structure to a circuit substrate, and electrically connect the semiconductor stacked structure to the circuit substrate

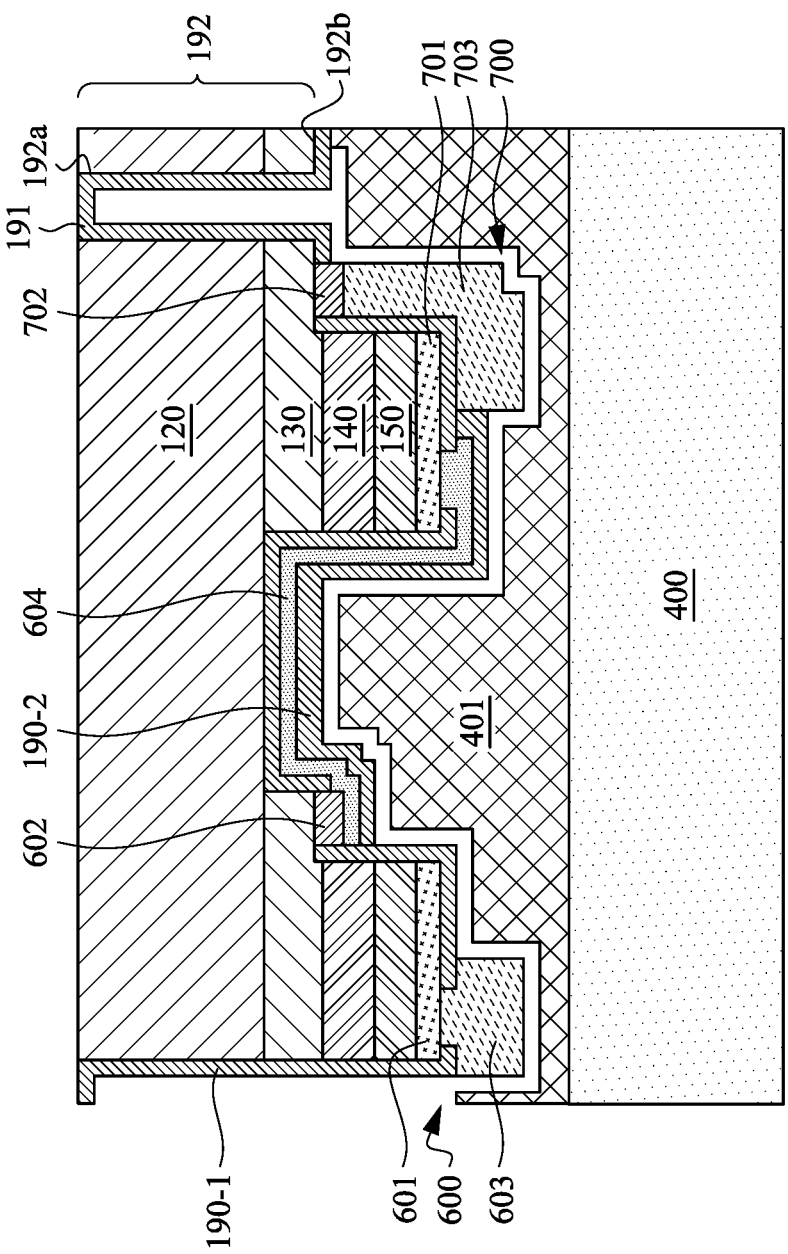
Fig. 17

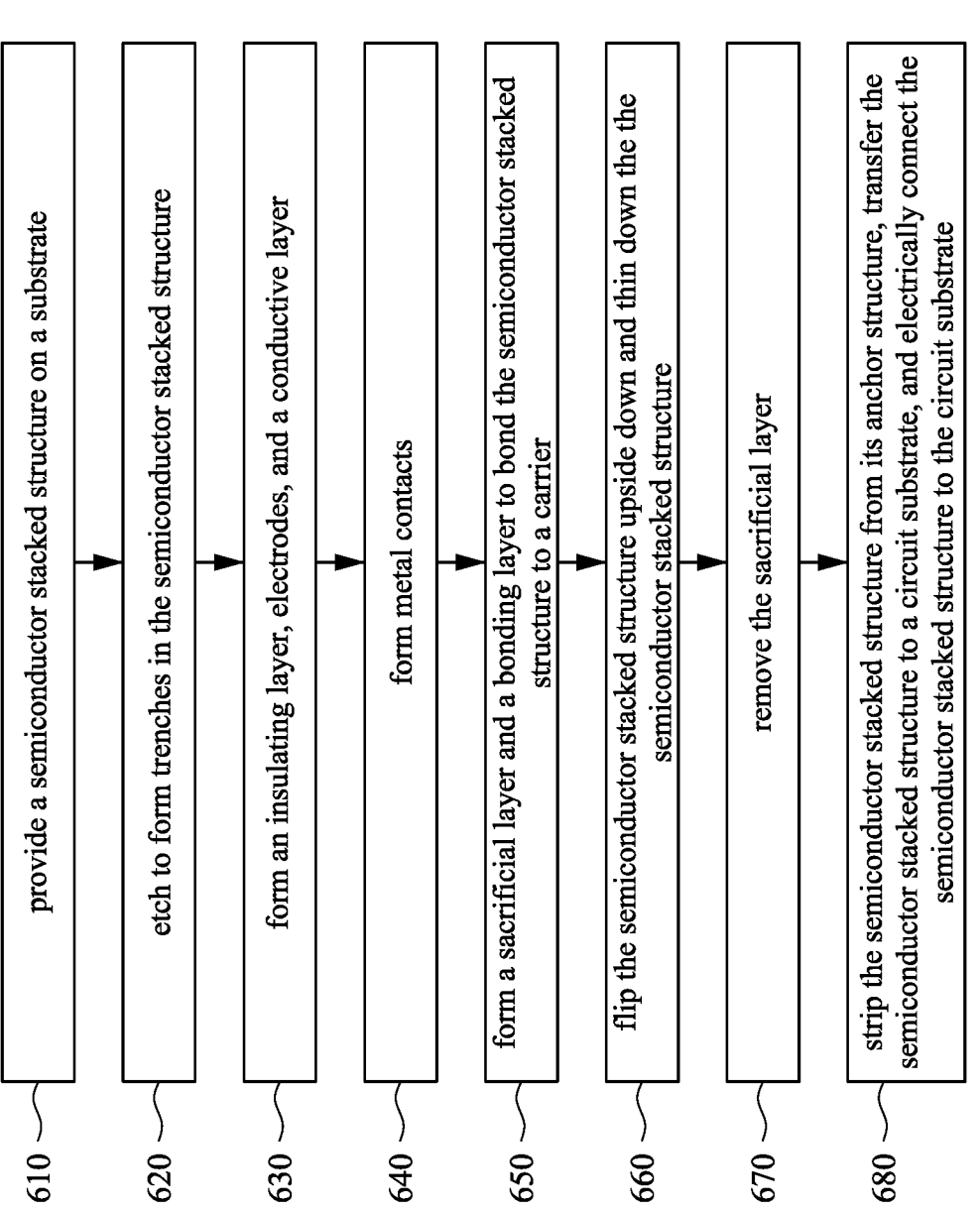

60

610   provide a semiconductor stacked structure on a substrate 620   etch to form trenches in the semiconductor stacked structure 630   form an insulating layer, electrodes, and a conductive layer 640   form metal contacts 650   form a sacrificial layer and a bonding layer to bond the semiconductor stacked structure to a carrier 660   flip the semiconductor stacked structure upside down and thin down the the semiconductor stacked structure 670   remove the sacrificial layer 680   strip the semiconductor stacked structure from its anchor structure, transfer the semiconductor stacked structure to a circuit substrate, and electrically connect the semiconductor stacked structure to the circuit substrate

Fig. 19

LIGHT-EMITTING ELECTRONIC DEVICE AND LIGHT-EMITTING PANEL

CROSS-REFERENCE TO RELATED APPLICATION

This application claims priority to Taiwan Application Serial Number 112113334, filed Apr. 10, 2023, which is herein incorporated by reference.

BACKGROUND

Field of Invention

The present disclosure relates to a light-emitting electronic device and a light-emitting panel.

Description of Related Art

Compared with liquid crystal displays, micro light-emitting diode displays have the advantages of lower power consumption, higher color saturation, and faster response time. In a currently widely used micro light-emitting diode display panel, each micro light-emitting diode has a corresponding driving circuit. To meet the demand for higher pixel density, the amount of driving transistors increases. However, the amount of the driving transistors is limited by the layout space of the display panel.

In addition, due to the limited layout space, the spacing between micro light-emitting diodes as well as the size and wiring of the driving transistors are limited. This may hinder yield rates of micro light-emitting diode displays from improving.

Accordingly, how to provide a light-emitting electronic device and a light-emitting panel to solve the aforementioned problems becomes an important issue to be solved by those in the industry.

SUMMARY

An aspect of the disclosure is to provide a light-emitting electronic device and a light-emitting panel that may efficiently solve the aforementioned problems.

According to some embodiments of the disclosure, a light-emitting electronic device includes a first electronic component, a second electronic component, an insulating layer, a conductive layer, an anchor structure, and a tether. The first electronic component includes a plurality of semiconductor layers vertically stacked together, a first electrode, and a second electrode. The second electronic component includes a plurality of semiconductor layers vertically stacked together, a first electrode, and a second electrode. The insulating layer extends along a lower surface and a plurality of sidewalls of the first electronic component and along a lower surface and a plurality of sidewalls of the second electronic component. The conductive layer is at least partially disposed in the insulating layer and is electrically connected to the second electrode of the first electronic component and the first electrode of the second electronic component. The anchor structure is laterally separated from the first electronic component and the second electronic component. The anchor structure includes a plurality of semiconductor layers vertically stacked together. The tether is connected to the first electronic component, the second electronic component, and the anchor structure.

In some embodiments of the present disclosure, the first electronic component and the second electronic component have a continuous undoped semiconductor layer.

In some embodiments of the present disclosure, the first electronic component is a light-emitting diode. The plurality of semiconductor layers of the first electronic component includes a first semiconductor layer, a second semiconductor layer, and an active layer disposed between the first semiconductor layer and the second semiconductor layer. The first electrode of the first electronic component is electrically connected to the first semiconductor layer of the first electronic component. The second electrode of the first electronic component is electrically connected to the second semiconductor layer of the first electronic component.

In some embodiments of the present disclosure, the second electronic component is a light-emitting diode. The plurality of semiconductor layers of the second electronic component includes a first semiconductor layer, a second semiconductor layer, and an active layer disposed between the first semiconductor layer and the second semiconductor layer. The first electrode of the second electronic component is electrically connected to the first semiconductor layer of the second electronic component. The second electrode of the second electronic component is electrically connected to the second semiconductor layer of the second electronic component.

In some embodiments of the present disclosure, wherein the first semiconductor layer of the first electronic component and the first semiconductor layer of the second electronic component include one of an n-type semiconductor and a p-type semiconductor. The second semiconductor layer of the first electronic component and the second semiconductor layer of the second electronic component include the other of the n-type semiconductor and the p-type semiconductor.

In some embodiments of the present disclosure, the second electronic component is a driving element.

In some embodiments of the present disclosure, the driving element is a high electron mobility transistor. The second electronic component further includes a third electrode electrically connected to one of the plurality of semiconductor layers of the second electronic component. The first electrode of the second electronic component is one of a source and a drain. The second electrode of the second electronic component is the other of the source and the drain. The third electrode is a gate.

In some embodiments of the present disclosure, the first semiconductor layer includes one of an n-type semiconductor and a p-type semiconductor. The second semiconductor layer includes the other of the n-type semiconductor and the p-type semiconductor.

In some embodiments of the present disclosure, the tether is a portion extending from the insulating layer. The tether is connected to the anchor structure.

In some embodiments of the present disclosure, the tether connects a top surface of the first electronic component, a top surface of the second electronic component, and a top surface of the anchor structure.

According to some other embodiments of the disclosure, a light-emitting panel includes a circuit substrate, a first electronic component, a second electronic component, an insulating layer, and a conductive layer. The circuit substrate has a plurality of bonding pads. The first electronic component includes a plurality of semiconductor layers vertically stacked together, a first electrode, and a second electrode. The first electrode of the first electronic component is electrically connected to a first one of the plurality of bonding pads. The second electronic component includes a plurality of semiconductor layers vertically stacked together, a first electrode, and a second electrode. The second electrode of the second electronic component is electrically connected to a second one of the plurality of bonding pads. The insulating layer extends along a lower surface and a plurality of sidewalls of the first electronic component and along a lower surface and a plurality of sidewalls of the second electronic component. The conductive layer is at least partially disposed in the insulating layer and is electrically connected to the second electrode of the first electronic component and the first electrode of the second electronic component.

In some embodiments of the present disclosure, the first electronic component and the second electronic component have a continuous undoped semiconductor layer.

In some embodiments of the present disclosure, the first electronic component is a light-emitting diode. The plurality of semiconductor layers of the first electronic component includes a first semiconductor layer, a second semiconductor layer, and an active layer disposed between the first semiconductor layer and the second semiconductor layer. The first electrode of the first electronic component is electrically connected to the first semiconductor layer of the first electronic component. The second electrode of the first electronic component is electrically connected to the second semiconductor layer of the first electronic component.

In some embodiments of the present disclosure, the second electronic component is a light-emitting diode. The plurality of semiconductor layers of the second electronic component includes a first semiconductor layer, a second semiconductor layer, and an active layer disposed between the first semiconductor layer and the second semiconductor layer. The first electrode of the second electronic component is electrically connected to the first semiconductor layer of the second electronic component. The second electrode of the second electronic component is electrically connected to the second semiconductor layer of the second electronic component.

In some embodiments of the present disclosure, the first semiconductor layer of the first electronic component and the first semiconductor layer of the second electronic component include one of an n-type semiconductor and a p-type semiconductor. The second semiconductor layer of the first electronic component and the second semiconductor layer of the second electronic component include the other of the n-type semiconductor and the p-type semiconductor.

In some embodiments of the present disclosure, the second electronic component is a driving element.

In some embodiments of the present disclosure, the driving element is a high electron mobility transistor. The second electronic component further includes a third electrode electrically connected to one of the plurality of semiconductor layers of the second electronic component. The first electrode of the second electronic component is one of a source and a drain. The second electrode of the second electronic component is the other of the source and the drain. The third electrode is a gate.

In some embodiments of the present disclosure, the first semiconductor layer includes one of an n-type semiconductor and a p-type semiconductor. The second semiconductor layer includes the other of the n-type semiconductor and the p-type semiconductor.

In some embodiments of the present disclosure, the light-emitting panel further includes a tether. The tether is connected to at least one of a top surface of the first electronic component, a sidewall of the first electronic component, a top surface of the second electronic component, and a sidewall of the second electronic component.

Accordingly, in the light-emitting electronic devices and light-emitting panels of some embodiments of the present disclosure, by integrating a light-emitting element and a driving element onto a semiconductor layer such as an undoped gallium nitride layer, the circuit may be simplified. Also, the light-emitting element and the driving element may be in turn disposed on the same side of the semiconductor layer, thereby increasing pixel density. Moreover, by integrating two light-emitting elements onto a semiconductor layer and connecting them in series, the circuit may be simplified and the spacing between the two light-emitting elements may be reduced. Furthermore, the total current of the light-emitting panel may be reduced while the driving voltage of the array substrate remains unchanged. This may reduce power consumption of the light-emitting panel. Meanwhile, the integrated light-emitting electronic device may reduce the number of mass transfers to be conducted and diminish defects that may be caused by complex circuits. Therefore, yield rates may be improved.

It is to be understood that both the foregoing general description and the following detailed description are by examples and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 3 is a flowchart of a method for manufacturing a light-emitting electronic device and a light-emitting panel according to some embodiments of the present disclosure;

FIG. 17 is a schematic diagram of a light-emitting electronic device according to some other embodiments of the present disclosure;

FIG. 19 is a flowchart of a method for manufacturing a light-emitting electronic device and a light-emitting panel according to some other embodiments of the present disclosure;

DETAILED DESCRIPTION

Figure 1:
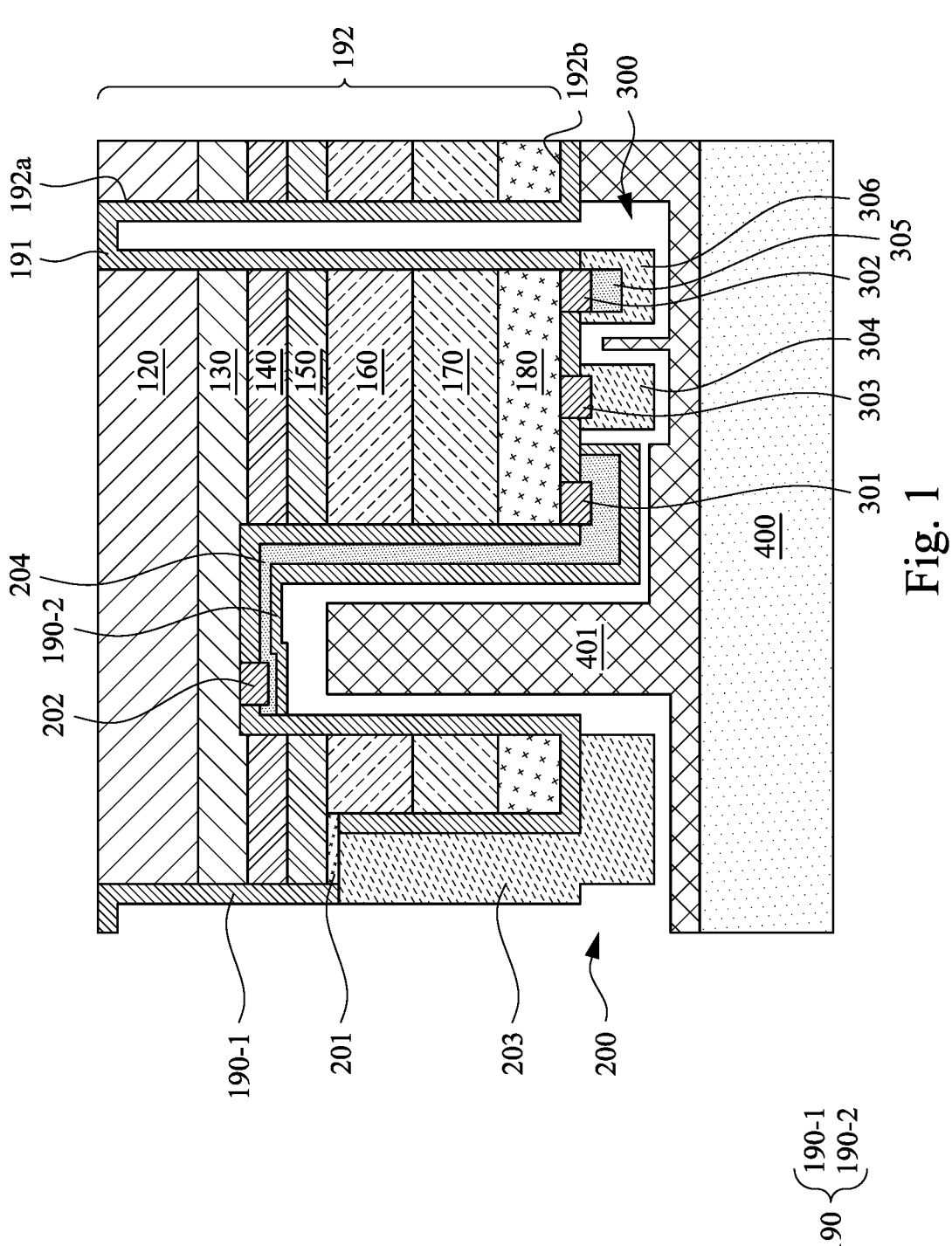
FIG. 1 is a schematic diagram of a light-emitting electronic device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a schematic diagram of a light-emitting electronic device 10 according to some embodiments of the present disclosure. As shown in FIG. 1, the light-emitting electronic device 10 includes a first electronic component 200 and a second electronic component 300. The first electronic component 200 and the second electronic component 300 are connected to an anchor structure 192 through a tether 191. As shown in FIG. 1, the anchor structure 192 is further connected to a bonding layer 401 on a carrier 400. In some embodiments, the carrier 400 may also be referred to as a substrate.

In some implementations, as shown in FIG. 1, the first electronic component 200 is a light-emitting diode (LED). The second electronic component 300 is a driving component, such as a high electron mobility transistor (HEMT).

As shown in FIG. 1, the first electronic component 200 includes a semiconductor stacked structure of a plurality of semiconductor layers vertically stacked together, such as the semiconductor layer 120 to the semiconductor layer 180 in FIG. 1, a first electrode 201 and a second electrode 202. In embodiments where the first electronic component 200 is a light-emitting diode, the semiconductor layer 150 serves as the first semiconductor layer of the first electronic component 200 and is electrically connected to the first electrode 201. The semiconductor layer 140 serves as an active layer of the first electronic component 200. The semiconductor layer 130 serves as the second semiconductor layer of the first electronic component 200 and is electrically connected to the second electrode 202.

In some embodiments, the semiconductor layer 150 is a p-type semiconductor layer. The semiconductor layer 130 is an n-type semiconductor layer. For example, the semiconductor layer 150 includes p-type gallium nitride (GaN). The semiconductor layer 130 includes n-type gallium nitride. In some embodiments, the semiconductor layer 140 includes indium gallium nitride (InGaN). In some embodiments, the semiconductor layer 140 includes a semiconductor stacked structure as a multiquantum well (MQW). The semiconductor stacked structure includes indium gallium nitride layers and gallium nitride layers stacked alternately. In some embodiments, the vertical height of the semiconductor layer 130 is 0.4 $\mu$m. The vertical height of the semiconductor layer 140 is 0.3 $\mu$m. The vertical height of the semiconductor layer 150 is 0.3 $\mu$m. In embodiments where the semiconductor layer 150 is a p-type semiconductor layer, the first electrode 201 includes an indium tin oxide (ITO) transparent conductive film.

As shown in FIG. 1, the second electronic component 300 includes a semiconductor stacked structure of a plurality of semiconductor layers vertically stacked together, such as the semiconductor layer 120 to the semiconductor layer 180 in FIG. 1, a first electrode 301 and a second electrode 302. In embodiments where the second electronic component 300 is a HEMT, the second electronic component 300 further includes a third electrode 303, as shown in FIG. 1. The first electrode 301, the second electrode 302, and the third electrode 303 are electrically connected to the semiconductor layer 180. The first electrode 301 and the second electrode 302 are source/drain. The third electrode 303 is a gate.

In embodiments where the second electronic component 300 is a HEMT, the semiconductor layer 180 serves as a barrier layer of the second electronic component 300. In some embodiments, the semiconductor layer 180 includes aluminum gallium nitride ($Al_xGa_{1-x}N$, $0<x\leq1$). In some embodiments, the vertical height of the semiconductor layer 180 is between 5 nm and 1000 nm. The semiconductor layer 170 serves as a spacer layer of the second electronic component 300 for increasing electron mobility and increasing drain current. In some embodiments, the semiconductor layer 170 includes aluminum nitride (AlN). The semiconductor layer 160 serves as a channel layer of the second electronic component 300. In some embodiments, the semiconductor layer 160 includes undoped gallium nitride.

As shown in FIG. 1, the first electronic component 200 and the second electronic component 300 have a continuous undoped semiconductor layer, such as the semiconductor layer 120. In other words, the first electronic component 200 and the second electronic component 300 share the semiconductor layer 120. In some embodiments, the semiconductor layer 120 includes undoped gallium nitride.

The light-emitting electronic device 10 further includes a conductive layer 204 and a conductive layer 305. As shown in FIG. 1, the conductive layer 204 is electrically connected to the second electrode 202 of the first electronic component 200 and the first electrode 301 of the second electronic component 300. The conductive layer 305 is electrically connected to the second electrode 302 of the second electronic component 300.

The light-emitting electronic device 10 further includes an insulating layer 190-1 and an insulating layer 190-2 (collectively referred to as an insulating layer 190). As shown in FIG. 1, the insulating layer 190-1 extends along sidewalls and surfaces of the first electronic component 200. Then, the insulating layer 190-1 connects sidewalls and surfaces of the second electronic component 300. The insulating layer 190-2 extends along the conductive layer 204, so that the insulating layer 190-1 and the insulating layer 190-2 surround the conductive layer 204. In some embodiments, conductive layer 204 is disposed at least partially within insulating layer 190.

The light-emitting electronic device 10 also includes an anchor structure 192. As shown in FIG. 1, the anchor structure 192 is laterally separated from the first electronic component 200 and the second electronic component 300. The anchor structure 192 includes a semiconductor stacked structure of a plurality of semiconductor layers vertically stacked together, such as the semiconductor layer 120 to the semiconductor layer 180.

In some embodiments, a portion extending from the insulating layer 190 serves as a tether 191. The tether 191 extends and connects to a sidewall 192a and a surface 192b of the anchor structure 192. The tether 191 connects the surface 192b of the anchor structure 192 with the bonding layer 401, so as to connect the first electronic component 200, the second electronic component 300 and the anchor structure 192 to the carrier 400.

The light-emitting electronic device 10 further includes a metal contact 203, a metal contact 304, and a metal contact 306. As shown in FIG. 1, the metal contact 203 is electrically connected to the first electrode 201 of the first electronic component 200. The metal contact 304 is electrically connected to the third electrode 303 of the second electronic component 300. The metal contact 306 is electrically connected to the conductive layer 305 of the second electronic component 300.

Figure 2:
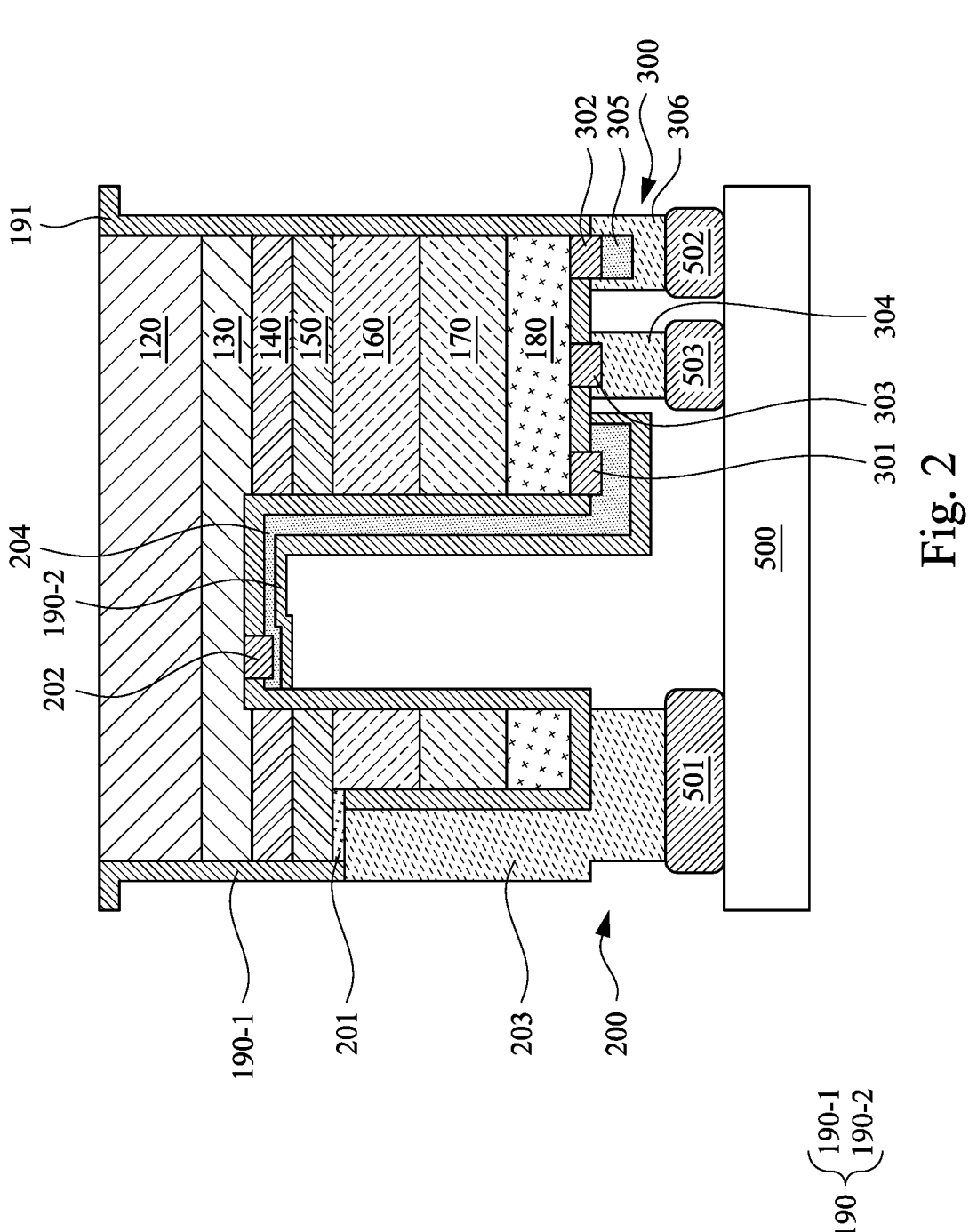
FIG. 2 is a schematic diagram of a light-emitting panel according to some embodiments of the present disclosure.

Reference is made to FIG. 2. FIG. 2 is a schematic diagram of a light-emitting panel 20 according to some embodiments of the present disclosure. As shown in FIG. 2, the light-emitting panel 20 includes a circuit substrate 500, a first electronic component 200, and a second electronic component 300. Similar to the light-emitting electronic device 10, in some embodiments, the first electronic component 200 is a light-emitting diode, and the second electronic component 300 is a driving element, such as an HEMT. The first electronic component 200 includes a semiconductor stacked structure, a first electrode 201 and a second electrode 202. The second electronic component 300 includes a semiconductor stacked structure, a first electrode 301, a second electrode 302, and a third electrode 303. The first electrode 301 and the second electrode 302 are source/drain. The third electrode 303 is a gate. As shown in FIG. 2, the first electronic component 200 and the second electronic component 300 have a continuous undoped semiconductor layer, such as the semiconductor layer 120. In some embodiments, the semiconductor layer 120 includes undoped gallium nitride.

In some embodiments, a plurality of bonding pads is disposed on the circuit substrate 500. For example, as shown in FIG. 2, the circuit substrate 500 has a first bonding pad 501, a second bonding pad 502 and a third bonding pad 503. The first bonding pad 501 is electrically connected to the first electrode 201 of the first electronic component 200 through the metal contact 203. The second bonding pad 502 is electrically connected to the second electrode 302 of the second electronic component 300 through the metal contact 306 and the conductive layer 305. The third bonding pad 503 is electrically connected to the third electrode 303 of the second electronic component 300 through the metal contact 304.

As shown in FIG. 2, the light-emitting panel 20 further includes a conductive layer 204. The conductive layer 204 is electrically connected to the second electrode 202 of the first electronic component 200 and the first electrode 301 of the second electronic component 300. In some embodiments, the conductive layer 204 is disposed at least partially in the insulating layer 190.

The light-emitting panel 20 also includes a tether 191. In some embodiments, the tether 191 is disposed on a sidewall of the first electronic component 200 or a sidewall of the second electronic component 300. As shown in FIG. 2, the tether 191 is disposed on the sidewall of the second electronic component 300.

Reference is made to FIG. 3 to FIG. 10. FIG. 3 is a flowchart of a method 30 for manufacturing the light-emitting electronic device 10 and the light-emitting panel 20 according to some embodiments of the present disclosure. FIG. 4 to FIG. 10 are schematic diagrams of intermediate stages of the method 30 for manufacturing the light-emitting electronic device 10 and the light-emitting panel 20 according to some embodiments of the present disclosure.

Reference is first made to FIG. 3. As shown in FIG. 3, the method 30 includes an operation 310. The operation 310 includes providing a semiconductor stacked structure on a substrate, such as on the substrate 110. The method 30 includes an operation 320. The operation 320 includes etching to form trenches in the semiconductor stacked structure. The method 30 includes an operation 330. The operation 330 includes forming an insulating layer (e.g., the insulating layer 190-1) and electrodes. The method 30 includes an operation 340. The operation 340 includes forming a conductive layer (e.g. the conductive layer 204) and other electrodes. The method 30 includes an operation 350. The operation 350 includes forming another insulating layer (e.g., the insulating layer 190-2) and metal contacts (e.g., the metal contact 203, the metal contact 304, and the metal contact 306). The method 30 includes an operation 360. The operation 360 includes forming a sacrificial layer and a bonding layer to bond the resultant semiconductor stacked structure to a carrier, such as forming the sacrificial layer 402 and the bonding layer 401 that is bonded to the carrier 400. The method 30 includes an operation 370. The operation 370 includes flipping the resultant semiconductor stacked structure upside down and thinning down the resultant semiconductor stacked structure. The method 30 includes an operation 380. The operation 380 includes removing the sacrificial layer, such as the sacrificial layer 402. The method 30 includes an operation 390. The operation 390 includes stripping the resultant semiconductor stacked structure from its anchor structure, transferring and electrically connecting the resultant semiconductor stacked structure to a circuit substrate, such as stripping the resultant semiconductor stacked structure from the anchor structure 192, transferring and electrically connecting the resultant semiconductor stacked structure to the circuit substrate 500.

Figure 4:
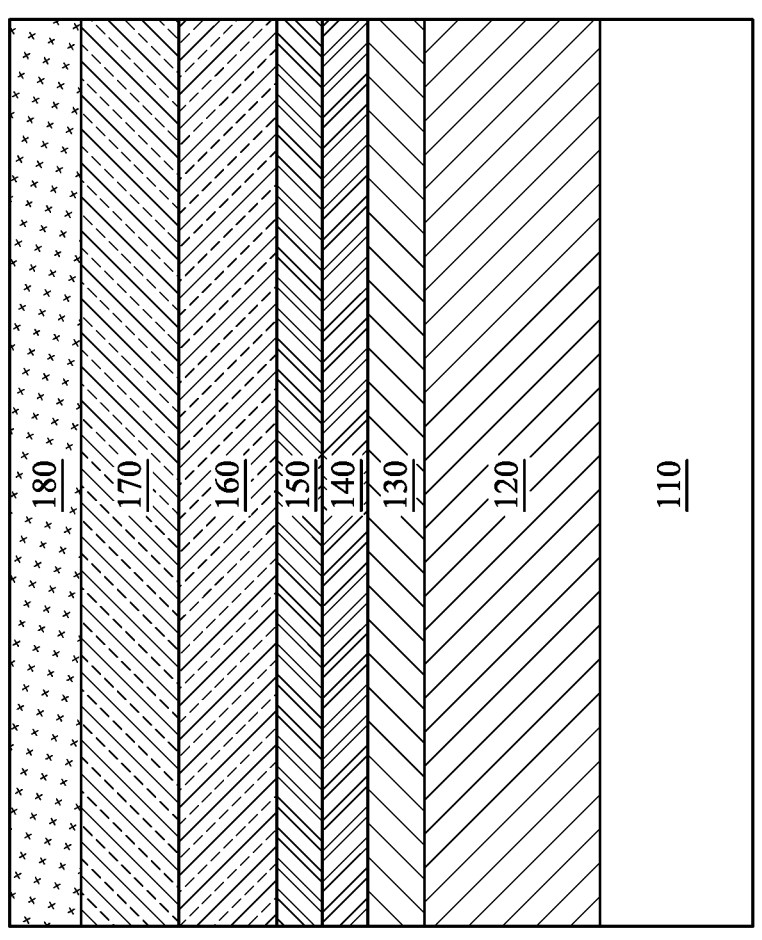
FIG. 4, FIG. 5, FIG. 6, FIG. 7, FIG. 8, FIG. 9, and FIG. 10 are schematic diagrams of intermediate stages of a method for manufacturing a light-emitting electronic device and a light-emitting panel according to some embodiments of the present disclosure.

Reference is made to FIG. 4. As shown in FIG. 4, the operation 310 provides the semiconductor stacked structure on the substrate 110. The semiconductor stacked structure includes a plurality of semiconductor layers vertically stacked together, such as the semiconductor layer 120 to the semiconductor layer 180. In some embodiments, the substrate 110 includes a sapphire wafer.

Figure 5:
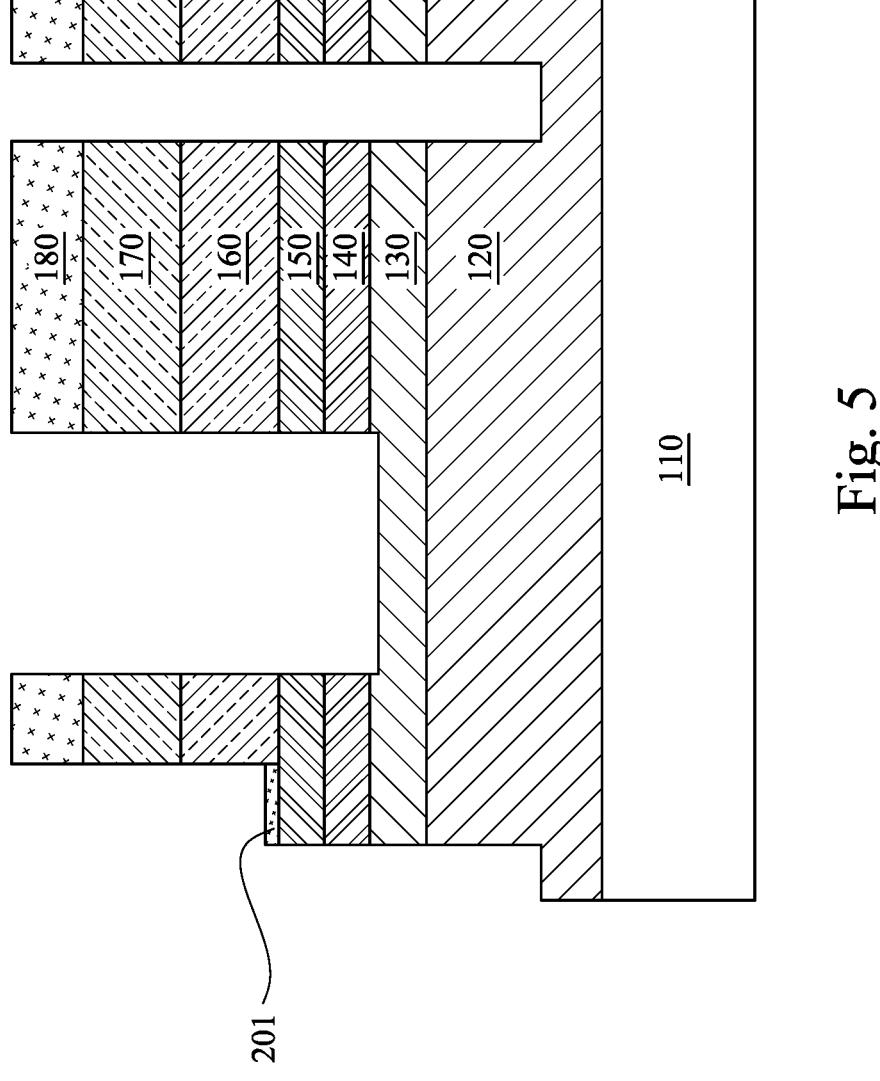

Reference is made to FIG. 5. FIG. 5 shows an intermediate stage after the operation 320 is conducted. The operation 320 performs a mesa etching process, such as through an inductively coupled plasma (ICP) etching process, to form trenches in the semiconductor stacked structure, as shown in FIG. 5.

It should be understood that a person having ordinary skill in the art may change the stacking order of the semiconductor layers and the trenches formed by the mesa etching process to achieve equivalent effect as the light-emitting electronic device 10 and the light-emitting panel 20 of the present disclosure.

In addition, in some embodiments, as shown in FIG. 5, an ITO transparent conductive film is disposed on the semiconductor layer 150 to act as the first electrode 201. The ITO transparent conductive film is electrically connected to the semiconductor layer 150.

Figure 6:
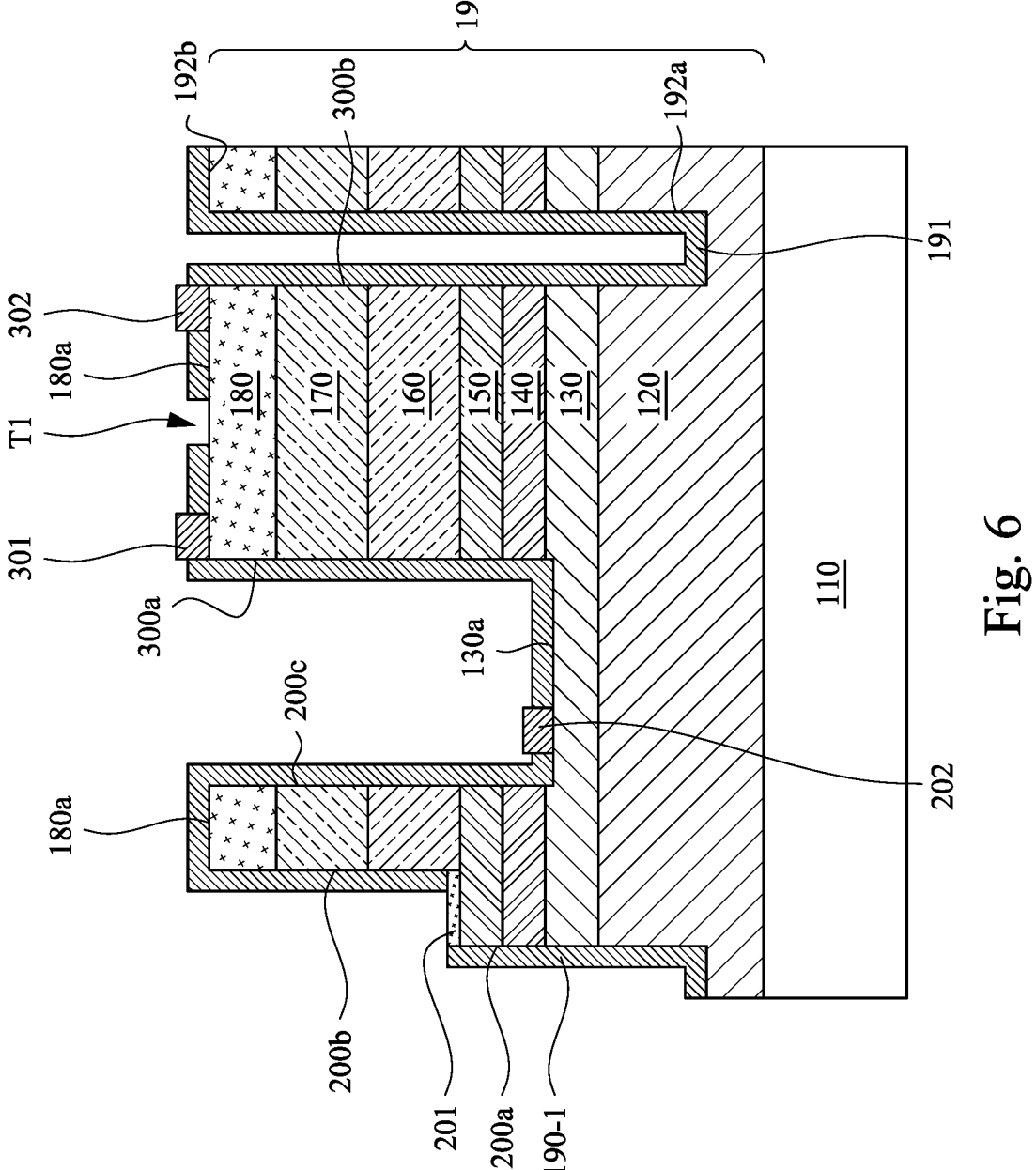

Reference is made to FIG. 6. FIG. 6 shows an intermediate stage after the operation 330 is conducted. As shown in FIG. 6, the operation 330 includes disposing the insulating layer 190-1, the second electrode 202, the first electrode 301, and the second electrode 302. The insulating layer 190-1 is disposed along the sidewall 200a, the sidewall 200b, the surface 180a, and the sidewall 200c. The insulating layer 190-1 then extends through the surface 130a and connects the sidewall 300a, the surface 180a, and the sidewall 300b. The second electrode 202 penetrates the insulating layer 190-1 and is electrically connected to the semiconductor layer 130. The first electrode 301 and the second electrode 302 penetrate the insulating layer 190-1 and are electrically connected to the semiconductor layer 180. As shown in FIG. 6, the insulating layer 190-1 has a trench T1 penetrating through the insulating layer 190-1. The trench T1 is configured for disposing the third electrode 303 (referring to FIG. 7) in subsequent operations. In some embodiments, as shown in FIG. 6, a portion extending from the insulating layer 190-1 acts as the tether 191. The tether 191 extends and connects to the sidewall 192a and the surface 192b of the anchor structure 192.

In some embodiments, the semiconductor layer 130 is a p-type semiconductor layer. The semiconductor layer 150 is an n-type semiconductor layer. For example, the semiconductor layer 130 includes p-type gallium nitride. The semiconductor layer 150 includes n-type gallium nitride. In embodiments where the semiconductor layer 130 is a p-type semiconductor layer, in the operation 320, an ITO transparent conductive film is disposed on the semiconductor layer 130 to act as the second electrode 202. Also, the first electrode 201 is disposed in the operation 330 along with the first electrode 301 and the second electrode 302.

Figure 7:
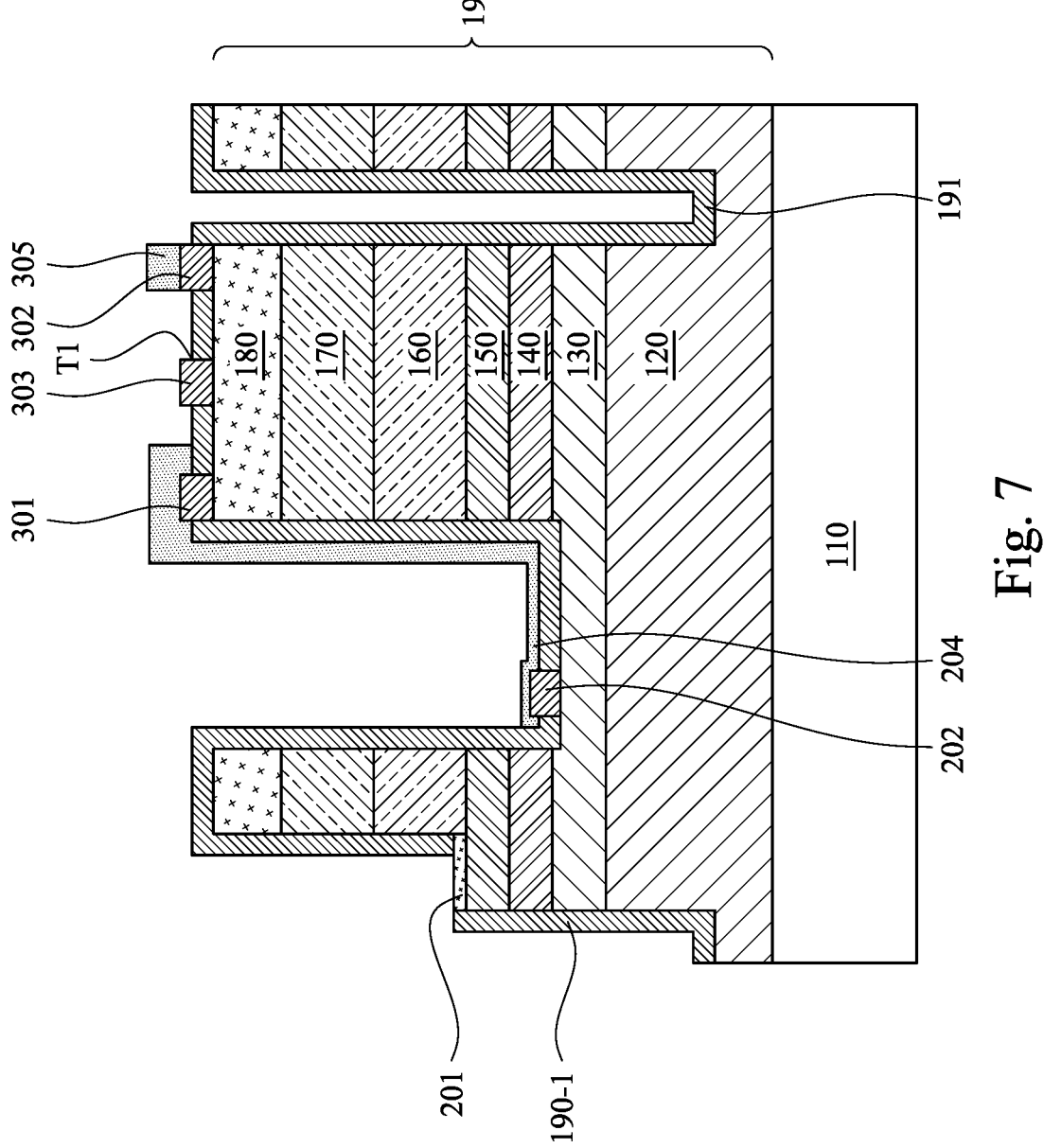

Reference is made to FIG. 7. FIG. 7 shows an intermediate stage after the operation 340 is conducted. The operation 340 includes disposing the conductive layer 204, the conductive layer 305, and the third electrode 303. As shown in FIG. 7, the conductive layer 204 is electrically connected to the second electrode 202 and the first electrode 301. The conductive layer 305 is electrically connected to the second electrode 302. The third electrode 303 is disposed in the trench T1 and is electrically connected to the semiconductor layer 180.

Figure 8:
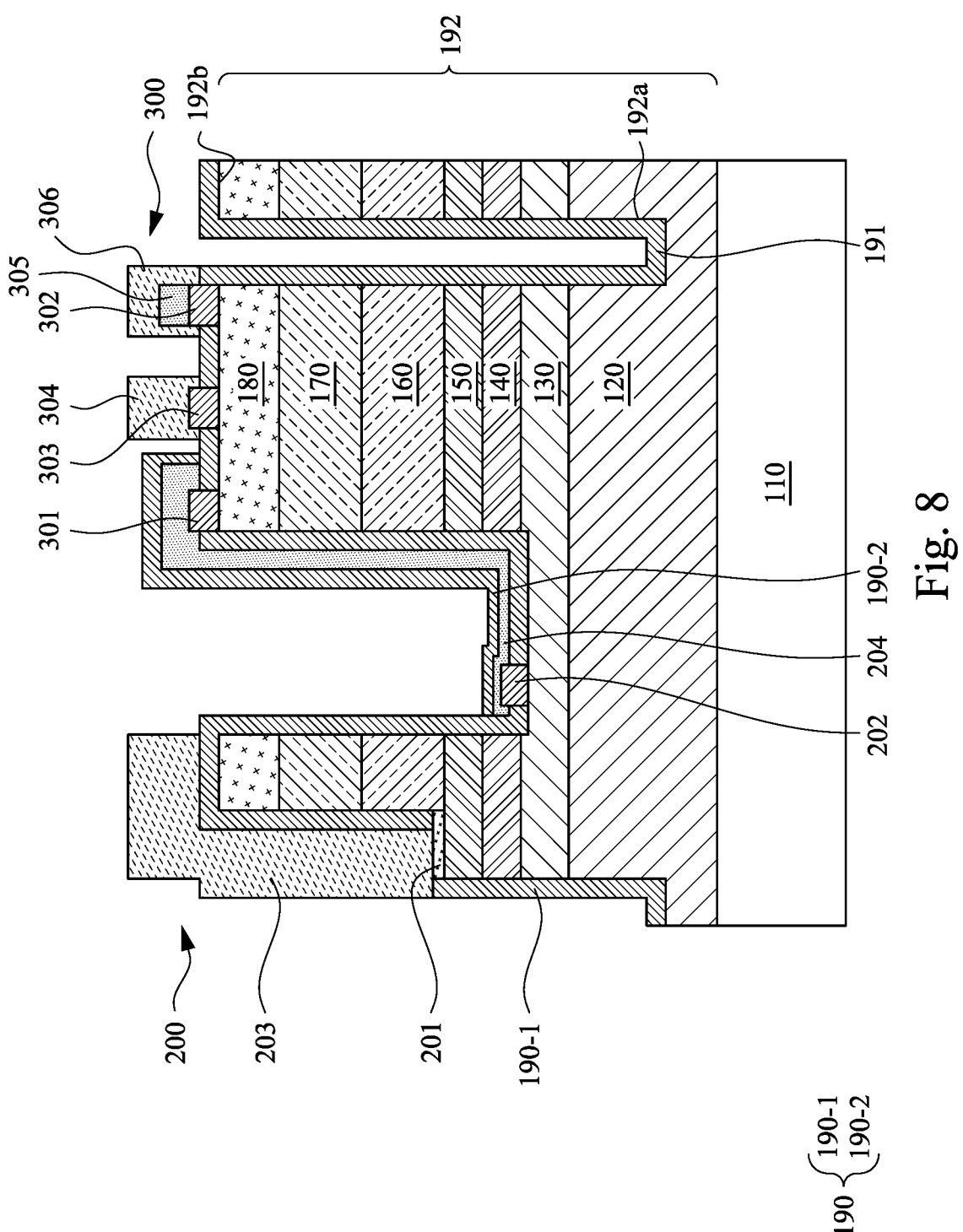

Reference is made to FIG. 8. FIG. 8 shows an intermediate stage after the operation 350 is conducted. The operation 350 includes disposing the insulating layer 190-2, the metal contact 203, the metal contact 304, and the metal contact 306. As shown in FIG. 8, the insulating layer 190-2 extends along the conductive layer 204 such that the conductive layer 204 is surrounded by the insulating layer 190-1 and the insulating layer 190-2. As such, the first electronic component 200 and the second electronic component 300 are formed. The first electronic component 200 and the second electronic component 300 are electrically connected through the conductive layer 204 and share the semiconductor layer 120.

Figure 9:
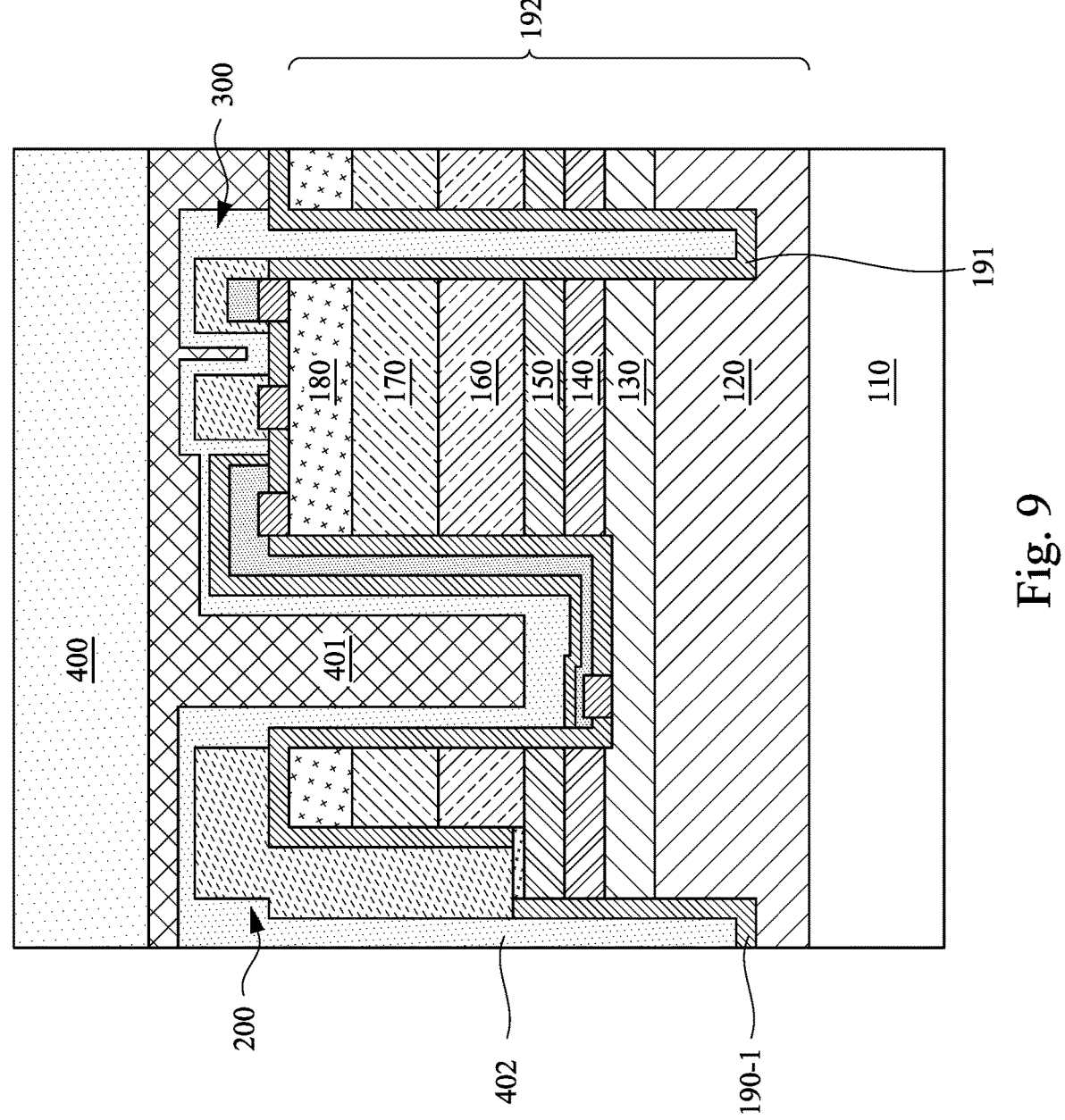

Reference is made to FIG. 9. FIG. 9 shows an intermediate stage after the operation 360 is conducted. The operation 360 includes disposing the sacrificial layer 402 and disposing the bonding layer 401 so as to bond the first electronic component 200, the second electronic component 300, and the anchor structure 192 to the carrier 400.

Figure 10:
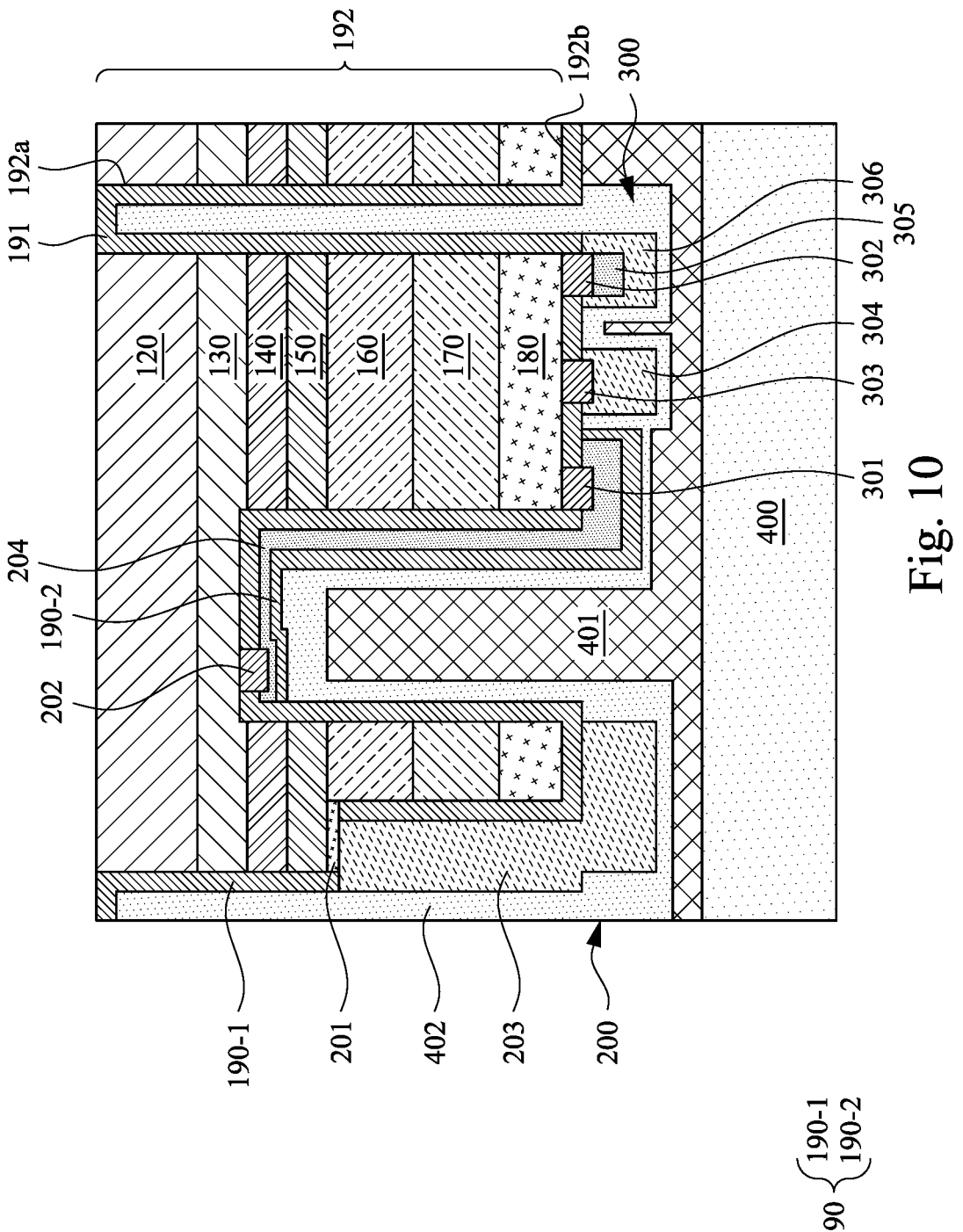

Reference is made to FIG. 10. FIG. 10 shows an intermediate stage after the operation 370 is conducted. The operation 370 includes flipping the resultant intermediate structure upside down and stripping the resultant intermediate structure from the substrate 110, such as through a laser liftoff (LLO) process. Then, the operation 370 further includes thinning, such as thinning the semiconductor layer 120 down, so that a part of the insulating layer 190-1 and the tether 191 is exposed through the semiconductor layer 120.

The intermediate structure resulted from FIG. 10 may further undergo the operation 380. The operation 380 includes removing the sacrificial layer 402, so that the first electronic component 200 and the second electronic component 300 are connected to the bonding layer 401 and the carrier 400 through the anchor structure 192 and the tether 191. The resultant structure after the operation 380 is the light-emitting electronic device 10, as shown in FIG. 1.

The light-emitting electronic device 10 further undergoes the operation 390. The operation 390 includes stripping the first electronic component 200 and the second electronic component 300 from the anchor structure 192. Then, the operation 390 includes transferring and electrically connecting the first electronic component 200 and the second electronic component 300 to the circuit substrate 500. To be more specific, referring back to FIG. 2, the first electrode 201 of the first electronic component 200 is electrically connected to the first bonding pad 501 of the circuit substrate 500 through the metal contact 203. The second electrode 302 of the second electronic component 300 is electrically connected to the second bonding pad 502 of the circuit substrate 500 through the conductive layer 305 and the metal contact 306. The third electrode 303 of the second electronic component 300 is electrically connected to the third bonding pad 503 of the circuit substrate 500 through the metal contact 304. The resultant structure after the operation 390 is the light-emitting panel 20, as shown in FIG. 2. In some embodiments, during the stripping process of the first electronic component 200 and the second electronic component 300 from the anchor structure 192, a portion of the tether 191 remains on the sidewall 300b of the second electronic component 300.

Figure 11:
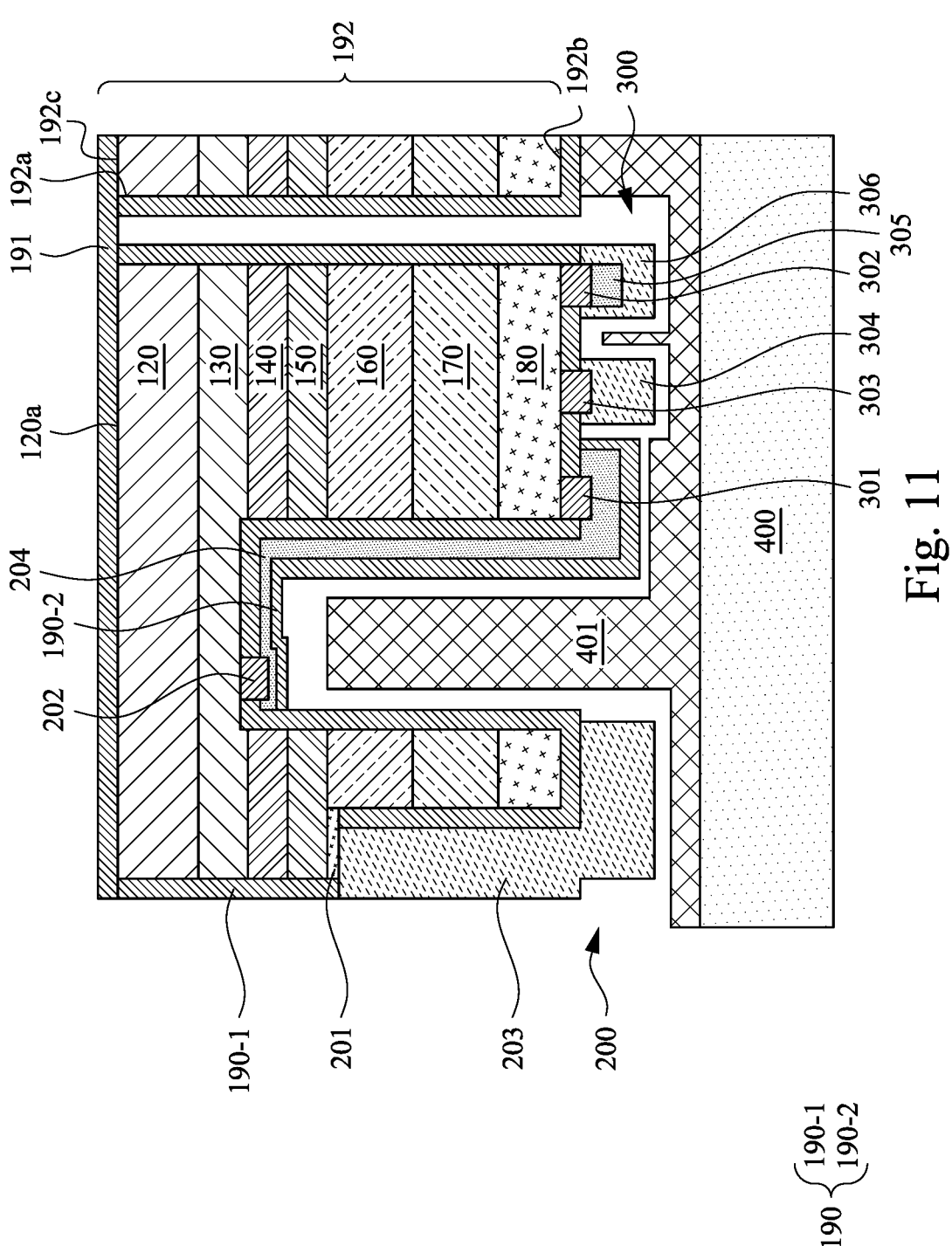
FIG. 11 is a schematic diagram of a light-emitting electronic device according to some embodiments of the present disclosure.

Reference is made to FIG. 11. FIG. 11 is a schematic diagram of a light-emitting electronic device 10' according to some embodiments of the present disclosure. In some embodiments, the tether 191 connects the surface 120a of the first electronic component 200 and the second electronic component 300 as well as the surface 192c of the anchor structure 192, as shown in FIG. 11. The first electronic component 200 and the second electronic component 300 are connected to the bonding layer 401 and the carrier 400 through the tether 191 and the anchor structure 192. In the method for manufacturing the light-emitting electronic device 10', the operation 370 may thin the semiconductor stacked structure down, so that the anchor structure 192 is separated from the first electronic component 200 and the second electronic component 300. Then, the tether 191 may be formed on the surface 120a and the surface 192c in an additional operation, so that the surface 120a is connected to the surface 192c, and the anchor structure 192 is connected to the first electronic component 200 and the second electronic component 300 through the tether 191.

Figure 12:
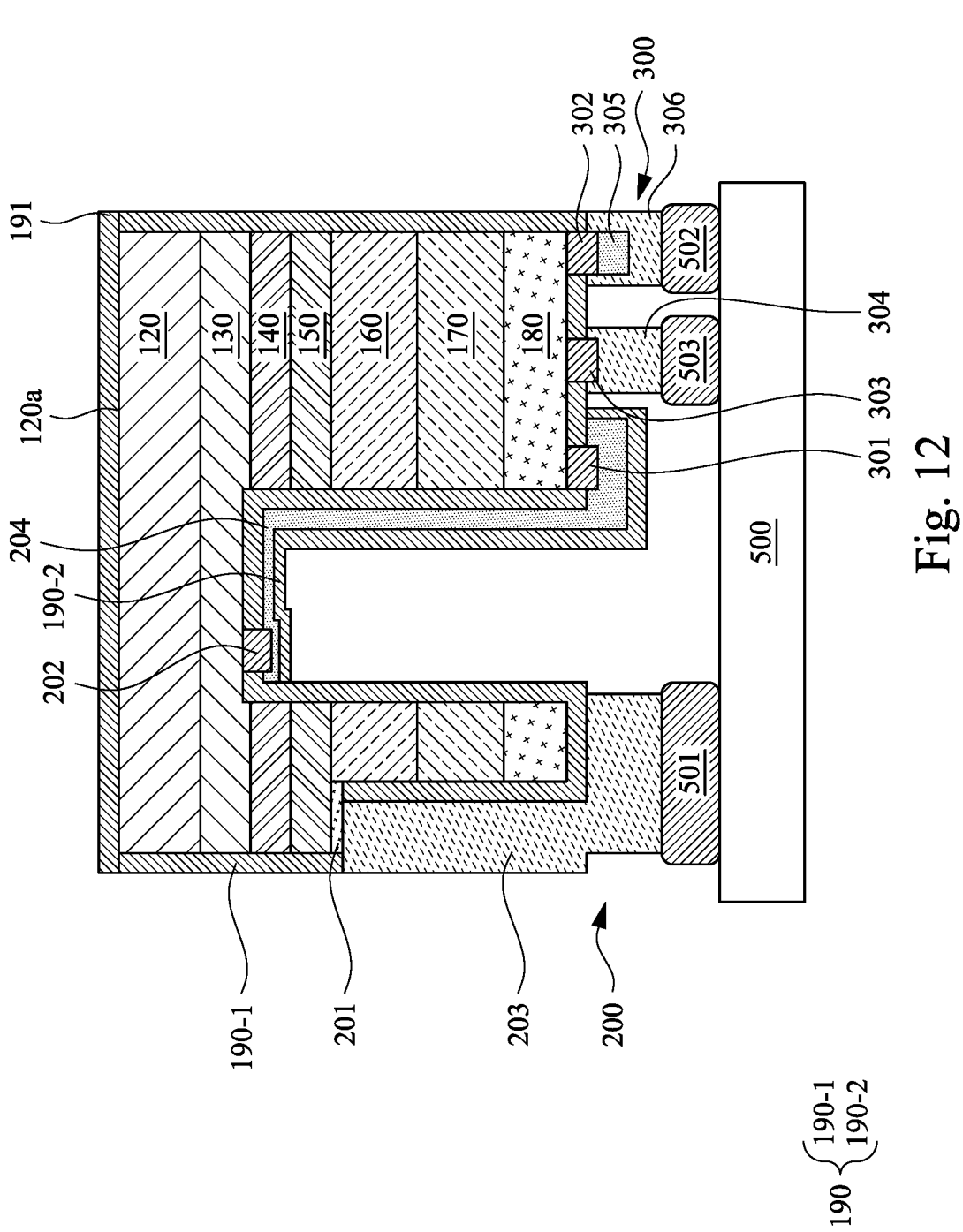
FIG. 12 is a schematic diagram of a light-emitting panel according to some embodiments of the present disclosure.

Reference is made to FIG. 12. FIG. 12 is a schematic diagram of a light-emitting panel 20' according to some embodiments of the present disclosure. In some embodiments, corresponding to the light-emitting electronic device 10', the tether 191 of the light-emitting panel 20' is disposed on the surface 120a of the first electronic component 200 and the second electronic component 300.

Figure 13:
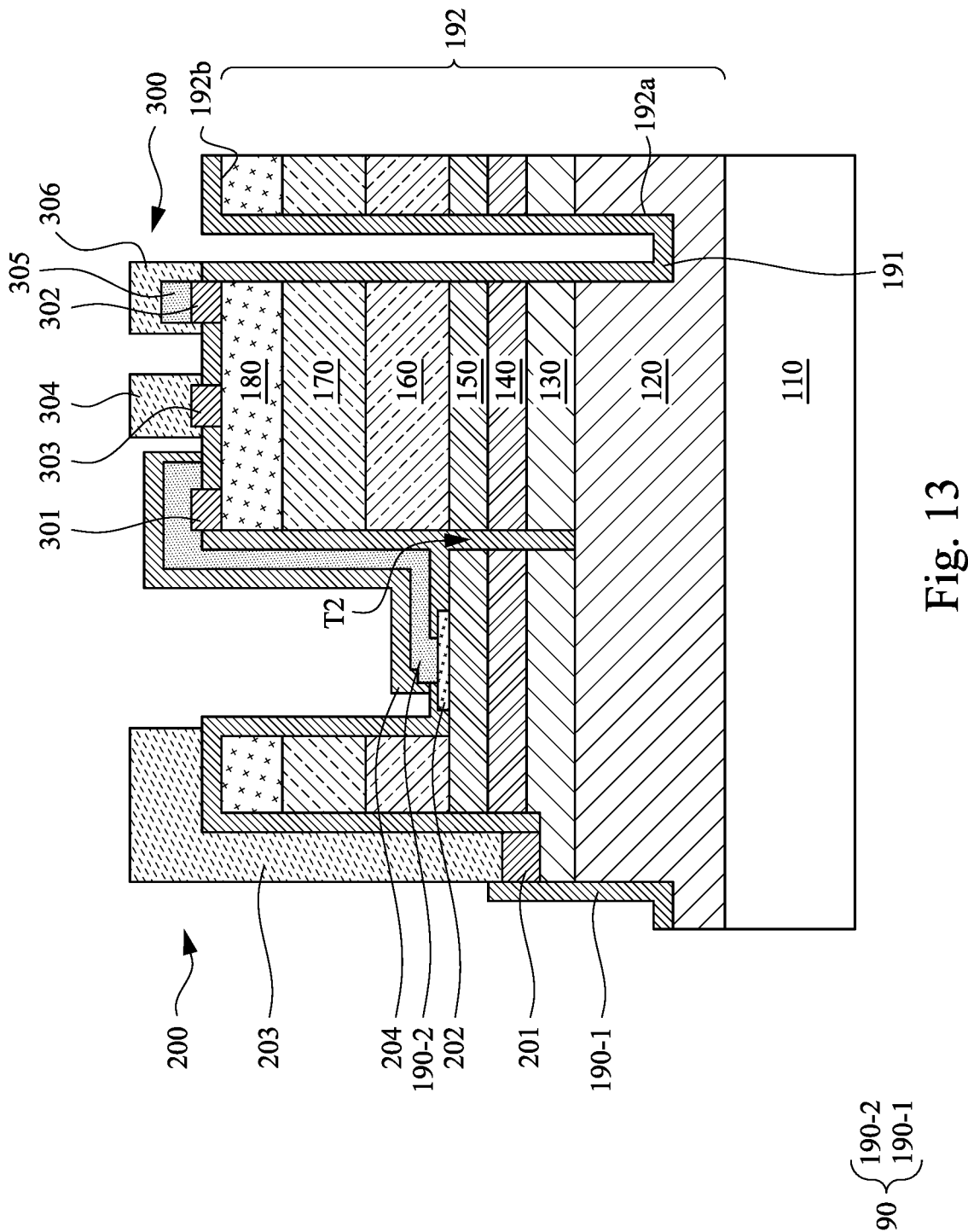
FIG. 13 is a schematic diagram of an intermediate stage of a method for manufacturing a light-emitting electronic device according to some embodiments of the present disclosure.
Figure 14:
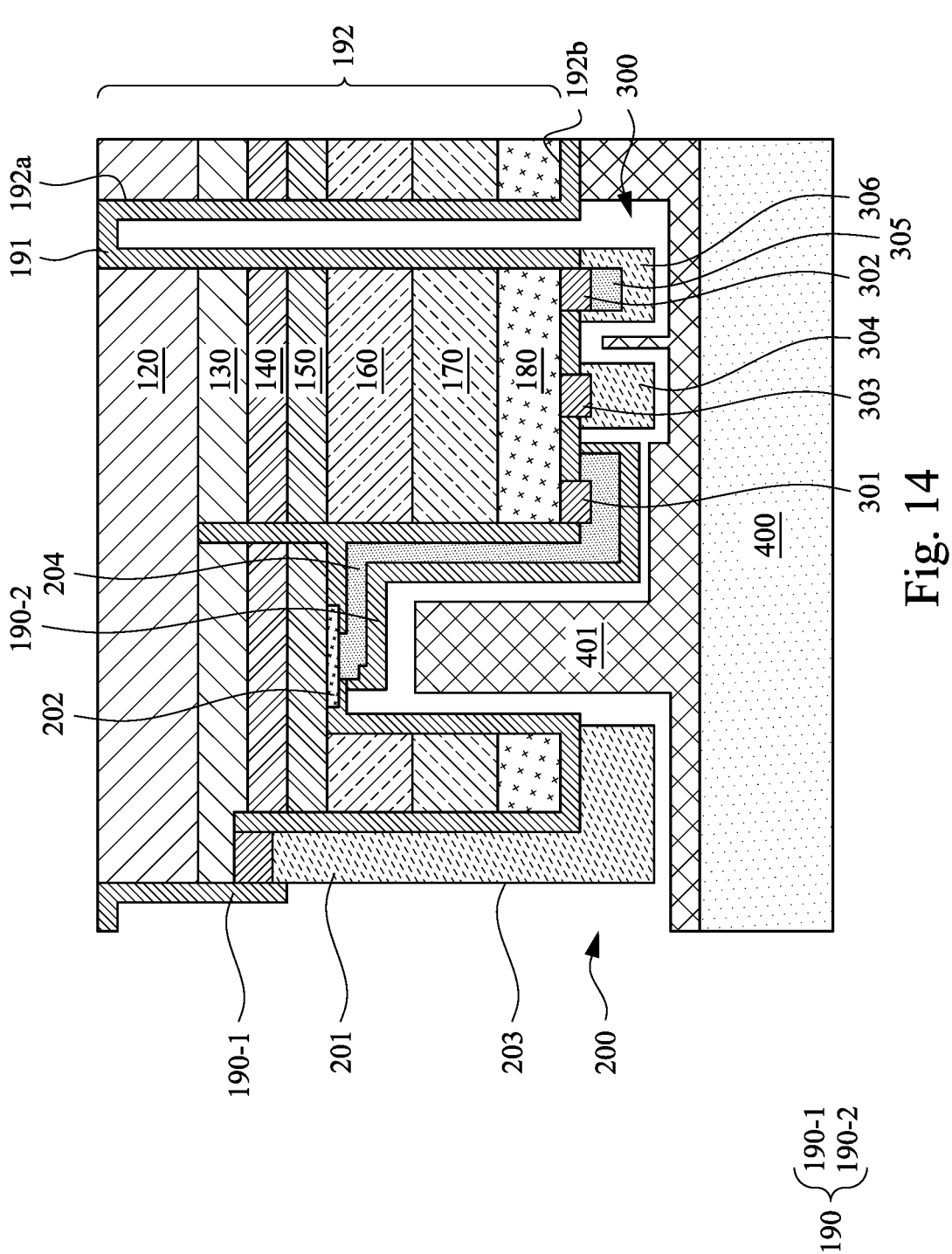
FIG. 14 is a schematic diagram of a light-emitting electronic device according to some embodiments of the present disclosure.

In some embodiments, the first electrode 201 of the first electronic component 200 is electrically connected to the semiconductor layer 130, which is n-type doped. The second electrode 202 is electrically connected to the semiconductor layer 150, which is p-type doped. Reference is made to FIG. 13. FIG. 13 is a schematic diagram of an intermediate stage of a method for manufacturing a light-emitting electronic device 10" (referring to FIG. 14) according to some embodiments of the present disclosure. In this method, the operation 320 additionally etches a trench T2 to separate the semiconductor layer(s) of the first electronic component 200 from the semiconductor layer(s) of the second electronic component 300, such as the semiconductor layer 130 to the semiconductor layer 150. Moreover, in the operation 320, an ITO transparent conductive film is disposed to act as the second electrode 202 of the first electronic component 200, while the first electrode 201 is disposed in the operation 330. The light-emitting electronic device 10" and the corresponding light-emitting panel 20" can be referred to FIG. 14 and FIG. 15.

Figure 15:
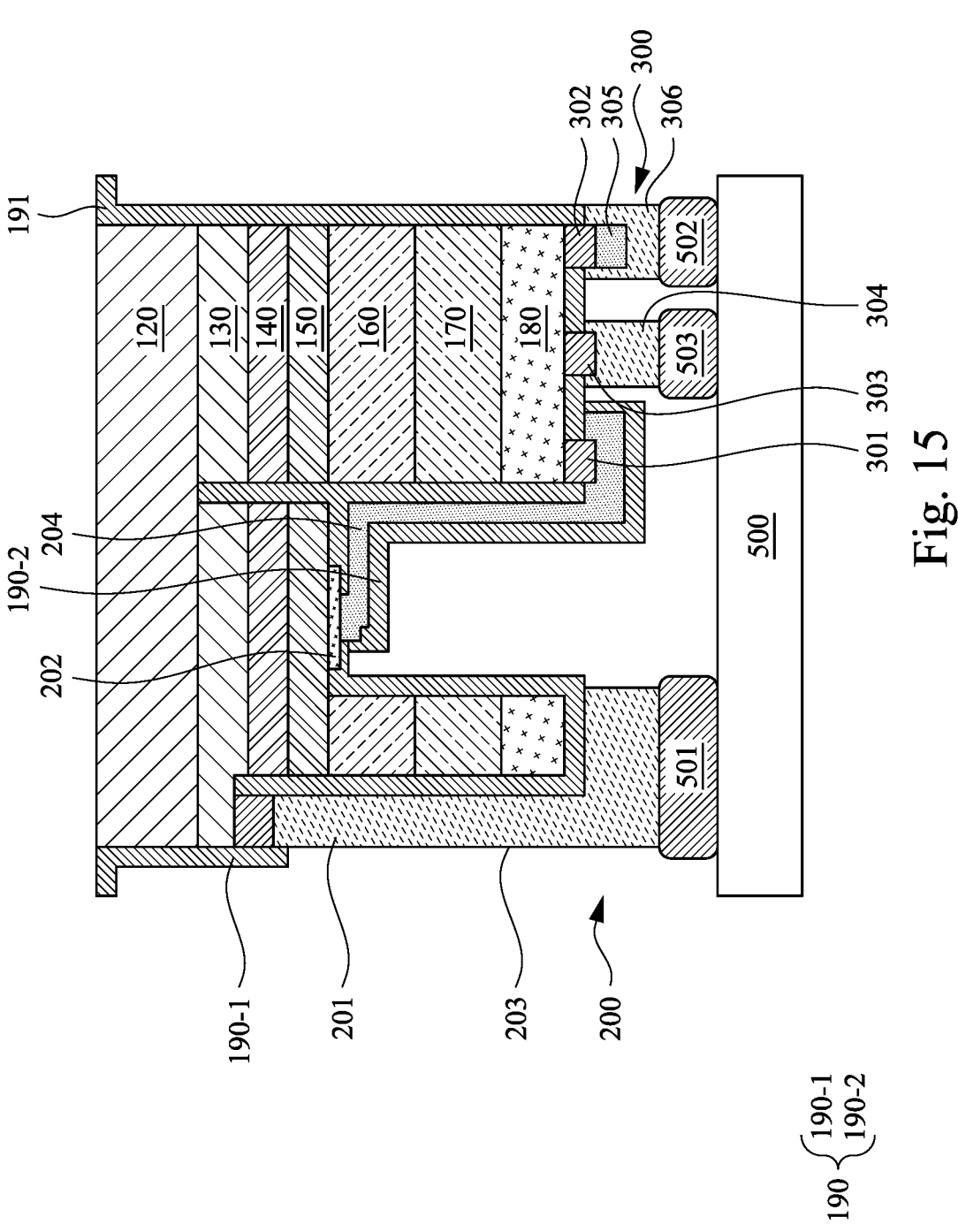
FIG. 15 is a schematic diagram of a light-emitting panel according to some embodiments of the present disclosure.
Figure 16A:
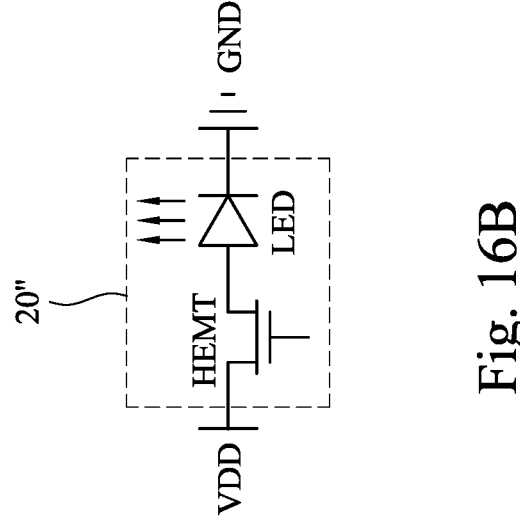
FIG. 16A and FIG. 16B are circuit diagrams of light-emitting panels according to some embodiments of the present disclosure.
Figure 16B:
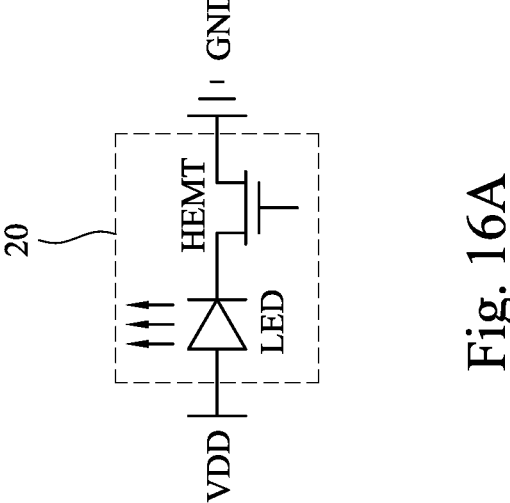

Reference is made to FIG. 16A and FIG. 16B. FIG. 16A and FIG. 16B are circuit diagrams of the light-emitting panel 20 and the light-emitting panel 20" according to some embodiments of the present disclosure. As shown in FIG. 16A, in the circuit including the light-emitting panel 20, the electrode of the first electronic component 200, such as the first electrode 201 in FIG. 2, is connected to the drain power voltage (VDD). The electrode of the second electronic component 300, such as the second electrode 302 in FIG. 2, is grounded. Meanwhile, as shown in FIG. 16B, in the circuit including the light-emitting panel 20", the electrode of the second electronic component 300, such as the second electrode 302 in FIG. 15, is connected to the drain power voltage. The electrode of the first electronic component 200, such as the first electrode 201 in FIG. 15, is grounded.

Reference is made to FIG. 17. FIG. 17 is a schematic diagram of a light-emitting electronic device 40 according to some other embodiments of the present disclosure. As shown in FIG. 17, the light-emitting electronic device 40 includes a first electronic component 600 and a second electronic component 700. The first electronic component 600 and the second electronic component 700 are connected to the anchor structure 192 through the tether 191. As shown in FIG. 17, the anchor structure 192 is further connected to the bonding layer 401 on the carrier 400.

In some embodiments, as shown in FIG. 17, the first electronic component 600 and the second electronic component 700 are light-emitting diodes. As shown in FIG. 17, the first electronic component 600 includes a semiconductor stacked structure of a plurality of semiconductor layers vertically stacked together, such as the semiconductor layer 120 to the semiconductor layer 150, a first electrode 601, and a second electrode 602. The second electronic component 700 includes a semiconductor stacked structure of a plurality of semiconductor layers vertically stacked together, such as the semiconductor layer 120 to the semiconductor layer 150, a first electrode 701, and a second electrode 702. The semiconductor layer 150 acts as a first semiconductor layer of the first electronic component 600 and the second electronic component 700. Two portions of the semiconductor layer 150 are electrically connected to the first electrode 601 and the first electrode 701, respectively. Two portions of the semiconductor layer 140 act as active layers of the first electronic component 600 and the second electronic component 700, respectively. The semiconductor layer 130 acts as a second semiconductor layer of the first electronic component 600 and the second electronic component 700. Two portions of the semiconductor layer 130 are electrically connected to the second electrode 602 and the second electrode 702, respectively.

As shown in FIG. 17, the first electronic component 600 and the second electronic component 700 have a continuous undoped semiconductor layer, such as the semiconductor layer 120. In some embodiments, the semiconductor layer 120 includes undoped gallium nitride.

In some embodiments, the semiconductor layer 150 is a p-type semiconductor layer. The semiconductor layer 130 is an n-type semiconductor layer. For example, the semiconductor layer 130 includes n-type doped gallium nitride. The semiconductor layer 150 includes p-type doped gallium nitride. In some embodiments, the semiconductor layer 140 includes indium gallium nitride. In some embodiments, a vertical height of the semiconductor layer 130 is 0.4 μm. A vertical height of the semiconductor layer 140 is 0.3 μm. A vertical height of the semiconductor layer 150 is 0.3 μm. In embodiments where the semiconductor layer 150 is a p-type semiconductor layer, the first electrode 601 and the first electrode 701 include an ITO transparent conductive film.

In some embodiments, the light-emitting electronic device 40 further includes a conductive layer 604. As shown in FIG. 17, the conductive layer 604 is electrically connected to the second electrode 602 of the first electronic component 600 and the first electrode 701 of the second electronic component 700.

The light-emitting electronic device 40 further includes an insulating layer 190-1 and an insulating layer 190-2 (collectively referred to as the insulating layer 190). As shown in FIG. 17, the insulating layer 190-1 extends along sidewalls and surfaces of the first electronic component 600. The insulating layer 190-1 then connects sidewalls and surfaces of the second electronic component 700. Meanwhile, the insulating layer 190-2 extends along the conductive layer 604, so that the conductive layer 604 is surrounded by the insulating layer 190-1 and the insulating layer 190-2. In some embodiments, the conductive layer 604 is disposed at least partially in the insulating layer 190.

The light-emitting electronic device 40 further includes an anchor structure 192. As shown in FIG. 17, the anchor structure 192 is laterally separated from the first electronic component 600 and the second electronic component 700. The anchor structure 192 includes a semiconductor stacked structure of a plurality of semiconductor layers vertically stacked together, such as the semiconductor layer 120 and the semiconductor layer 130.

In some embodiments, a portion extending from the insulating layer 190 acts as a tether 191. The tether 191 extends and connects to the sidewall 192a and the surface 192b of the anchor structure 192. The tether 191 connects the surface 192b of the anchor structure 192 with the bonding layer 401, so as to connect the first electronic component 600 and the second electronic component 700 to the carrier 400 through the tether 191 and the anchor structure 192.

The light-emitting electronic device 40 further includes a metal contact 603 and a metal contact 703. As shown in FIG. 17, the metal contact 603 is electrically connected to the first electrode 601 of the first electronic component 600. The metal contact 703 is electrically connected to the second electrode 702 of the second electronic component 700.

Figure 18:
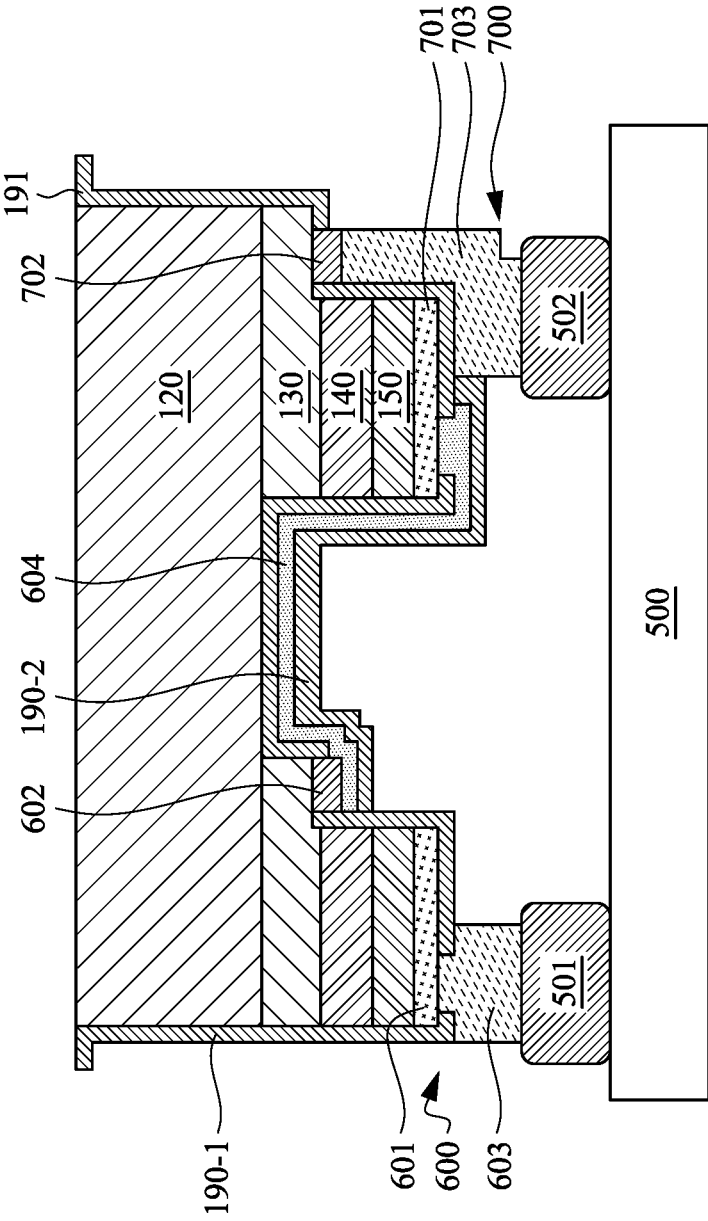
FIG. 18 is a schematic diagram of a light-emitting panel according to some other embodiments of the present disclosure.

Reference is made to FIG. 18. FIG. 18 is a schematic diagram of a light-emitting panel 50 according to some other embodiments of the present disclosure. As shown in FIG. 18, the light-emitting panel 50 includes a circuit substrate 500, a first electronic component 600, and a second electronic component 700. Similar to the light-emitting electronic device 40, in some embodiments, the first electronic component 600 and the second electronic component 700 are light-emitting diodes. As shown in FIG. 18, the first electronic component 600 and the second electronic component 700 have a continuous undoped semiconductor layer, such as the semiconductor layer 120. In some embodiments, the semiconductor layer 120 includes undoped gallium nitride.

As shown in FIG. 18, a plurality of bonding pads is disposed on the circuit substrate 500. For example, as shown in FIG. 18, the circuit substrate 500 has a first bonding pad 501 and a second bonding pad 502. The first bonding pad 501 is electrically connected to the first electrode 601 of the first electronic component 600 through the metal contact 603. The second bonding pad 502 is electrically connected to the second electrode 702 of the second electronic component 700 through the metal contact 703.

As shown in FIG. 18, the light-emitting panel 50 further includes a conductive layer 604. The conductive layer 604 is electrically connected to the second electrode 602 of the first electronic component 600 and the first electrode 701 of the second electronic component 700. In some embodiments, the conductive layer 604 is disposed at least partially in the insulating layer 190.

The light-emitting panel 50 further includes a tether 191. In some embodiments, the tether 191 is disposed on the sidewall of the first electronic component 600 or the sidewall of the second electronic component 700. As shown in FIG. 18, the tether 191 is disposed on the sidewall of the second electronic component 700.

Reference is made to FIG. 19 to FIG. 26. FIG. 19 is a flowchart of a method 60 for manufacturing the light-emitting electronic device 40 and the light-emitting panel 50 according to some other embodiments of the present disclosure. FIG. 20 to FIG. 26 are schematic diagrams of intermediate stages of the method 60 for manufacturing the light-emitting electronic device 40 and the light-emitting panel 50 according to some other embodiments of the present disclosure.

Reference is made to FIG. 19. As shown in FIG. 19, the method 60 includes an operation 610. The operation 610 includes providing a semiconductor stacked structure on a substrate, such as the substrate 110. The method 60 includes an operation 620. The operation 620 includes etching to form trenches in the semiconductor stacked structure. The method 60 includes an operation 630. The operation 630 includes forming an insulating layer, electrodes, and a conductive layer, such as the insulating layer 190-1, the first electrode 601, the first electrode 701, the second electrode 702, the conductive layer 604, and the insulating layer 190-2. The method 60 includes an operation 640. The operation 640 includes forming metal contacts, such as the metal contact 603 and the metal contact

703. The method 60 includes an operation 650. The operation 650 includes forming a sacrificial layer and a bonding layer to bond the resultant semiconductor stacked structure to a carrier, such as forming the sacrificial layer 402 and the bonding layer 401 that is bonded to the carrier 400. The method 60 includes an operation 660. The operation 660 includes flipping the resultant semiconductor stacked structure upside down and thinning down the resultant semiconductor stacked structure. The method 60 includes an operation 670. The operation 670 includes removing the sacrificial layer, such as the sacrificial layer 402. The method 60 includes an operation 680. The operation 680 includes stripping the resultant semiconductor stacked structure from its anchor structure, transferring and electrically connecting the resultant semiconductor stacked structure to a circuit substrate, such as stripping the resultant semiconductor stacked structure from the anchor structure 192, transferring and electrically connecting the resultant semiconductor stacked structure to the circuit substrate 500.

Figure 20:
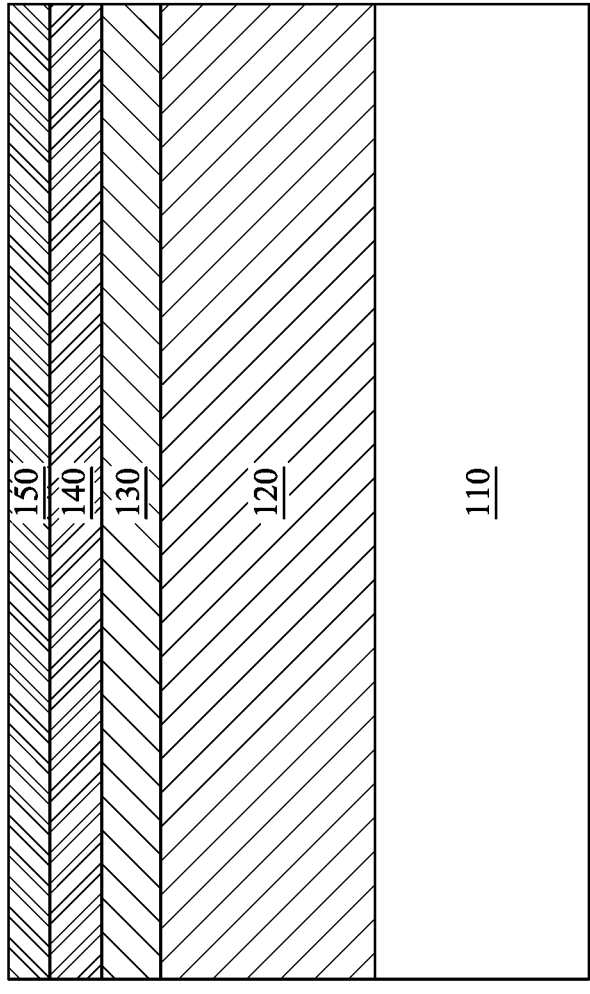
FIG. 20, FIG. 21, FIG. 22, FIG. 23, FIG. 24, FIG. 25, FIG. 26, and FIG. 27 are schematic diagrams of intermediate stages of a method for manufacturing a light-emitting electronic device and a light-emitting panel according to some other embodiments of the present disclosure.

Reference is made to FIG. 20. As shown in FIG. 20, the operation 610 provides a semiconductor stacked structure on the substrate 110. The semiconductor stacked structure includes a plurality of semiconductor layers vertically stacked together, such as the semiconductor layer 120 to the semiconductor layer 150. In some embodiments, the substrate 110 includes a sapphire wafer.

Figure 21:
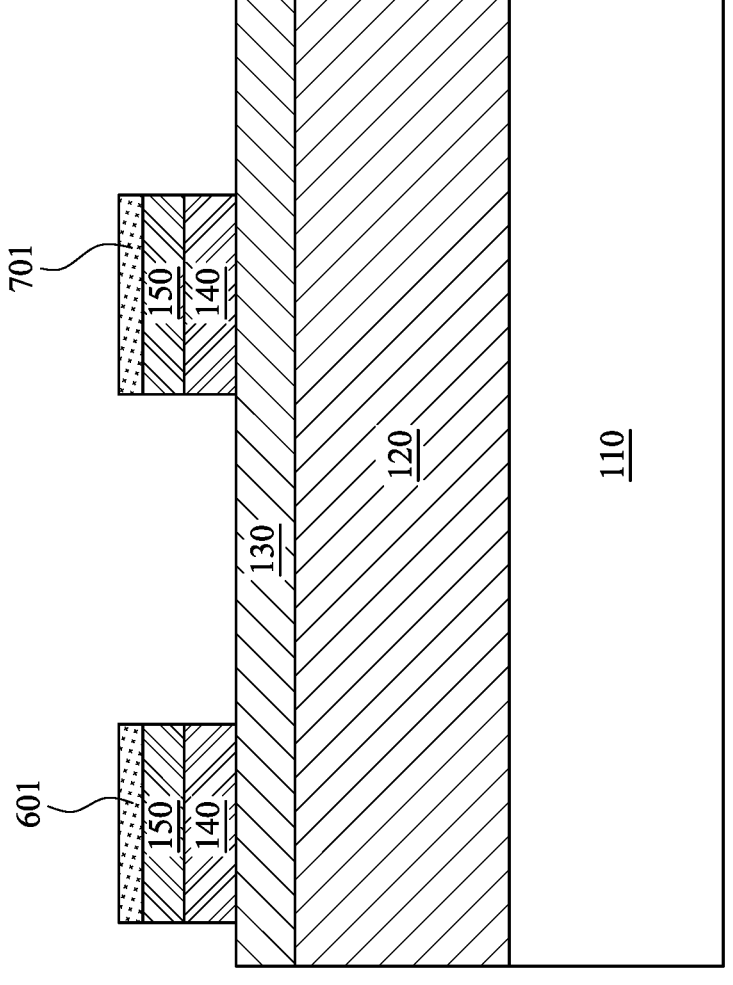
Figure 22:
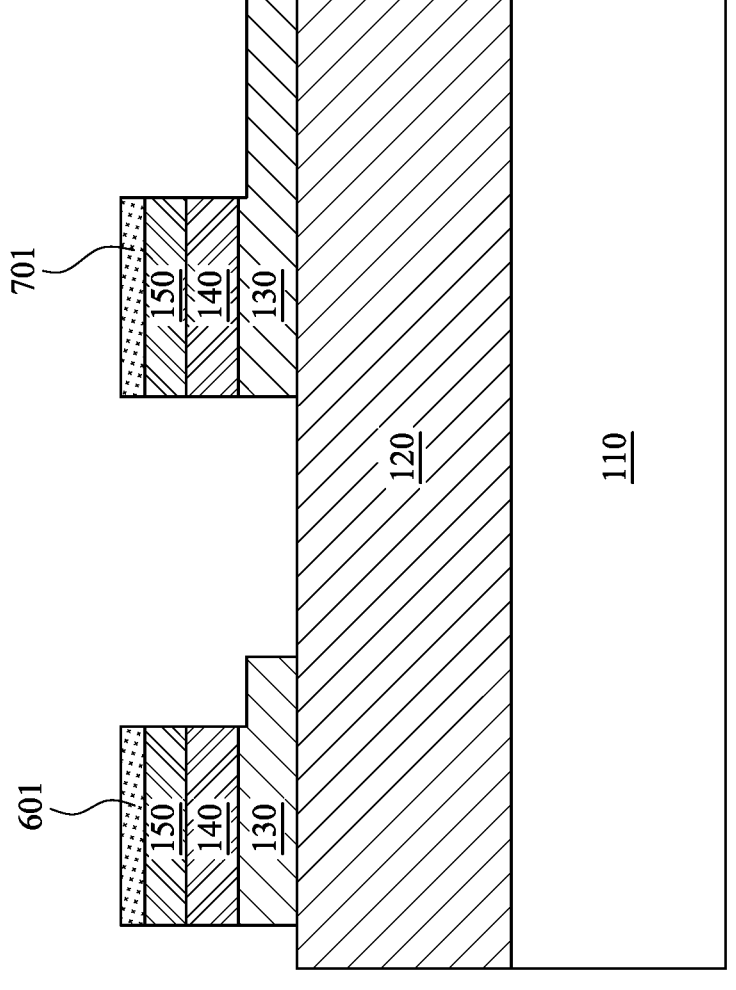
Figure 23:
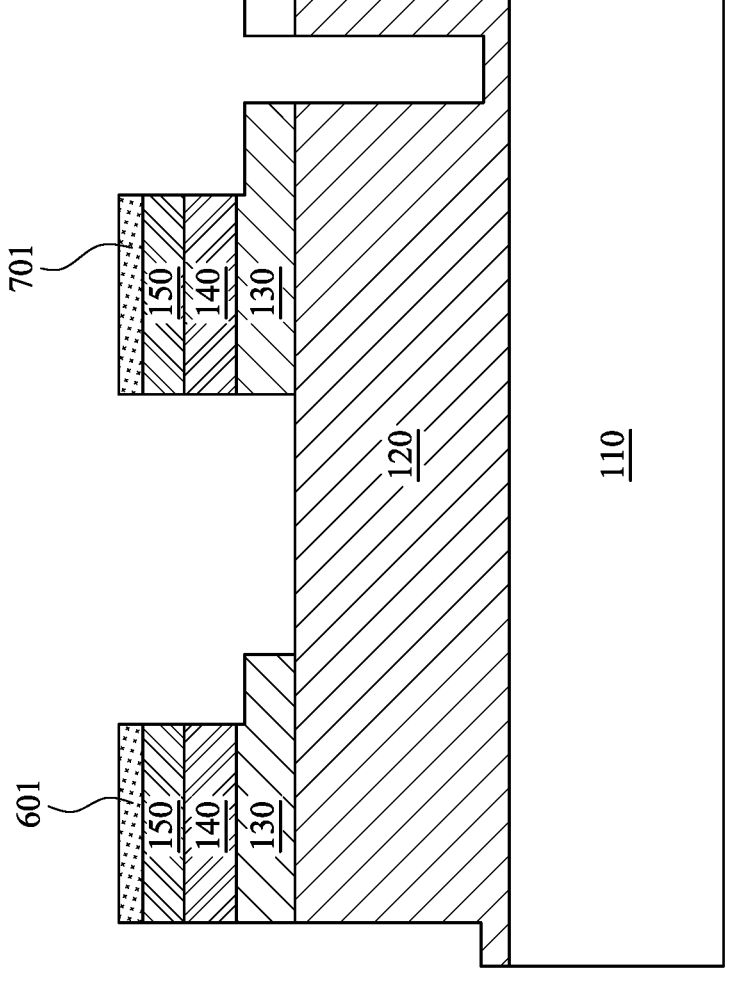

Reference is made to FIG. 21 to FIG. 23. FIG. 21 to FIG. 23 show intermediate stages during the operation 620. The operation 620 includes performing a first mesa etching process, such as through an ICP etching process, to form a preliminary trench structure on the semiconductor stacked structure, as shown in FIG. 21. In addition, in some embodiments, as shown in FIG. 21, the operation 620 includes disposing ITO transparent conductive films as the first electrode 601 and the first electrode 701. The first electrode 601 and the first electrode 701 are electrically connected to the semiconductor layer 150. Next, as shown in FIG. 22 and FIG. 23, the operation 620 includes performing a second and a third mesa etching process to form the trench structure as shown in FIG. 23.

Figure 24:
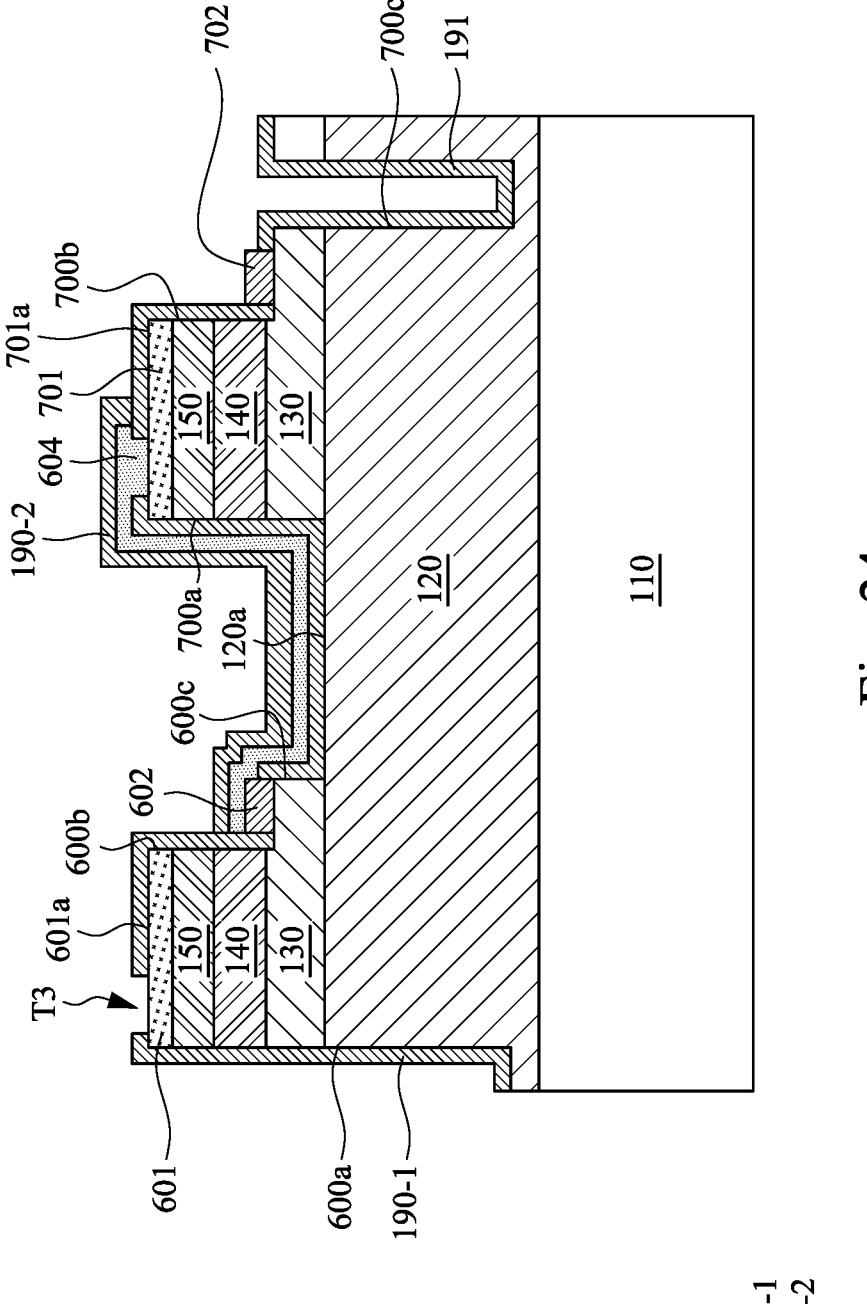

Reference is made to FIG. 24. FIG. 24 shows an intermediate stage after the operation 630 is conducted. As shown in FIG. 24, the operation 630 includes disposing the insulating layer 190-1, the second electrode 602, the second electrode 702, the conductive layer 604, and the insulating layer 190-2. The insulating layer 190-1 is disposed along the sidewall 600a, the surface 601a, the sidewall 600b, and the sidewall 600c. The insulating layer 190-1 then extends through the surface 120a and connects the sidewall 700a, the surface 701a, the sidewall 700b, and the sidewall 700c. As shown in FIG. 24, the insulating layer 190-1 has a trench T3 configured for disposing a metal contact 603 (referring to FIG. 25) in the subsequent operations. The second electrode 602 and the second electrode 702 penetrate the insulating layer 190-1. The second electrode 602 and the second electrode 702 are electrically connected to the semiconductor layer 130. In the operation 630, a conductive layer 604 is further provided to electrically connect the second electrode 602 and the first electrode 701. The operation 630 further disposes the insulating layer 190-2. As shown in FIG. 24, the insulating layer 190-2 extends along the conductive layer 604 such that the conductive layer 604 is surrounded by the insulating layer 190-1 and the insulating layer 190-2.

In some embodiments, the semiconductor layer 130 is a p-type semiconductor layer. The semiconductor layer 150 is an n-type semiconductor layer. For example, the semiconductor layer 130 includes p-type gallium nitride. The semiconductor layer 150 includes n-type gallium nitride. In embodiments where the semiconductor layer 130 is a p-type semiconductor layer, the operation 620 includes disposing an ITO transparent conductive film on the semiconductor layer 130 to act as the second electrode 602 and the second electrode 702, while the first electrode 601 and the first electrode 701 are disposed in the operation 630.

Figure 25:
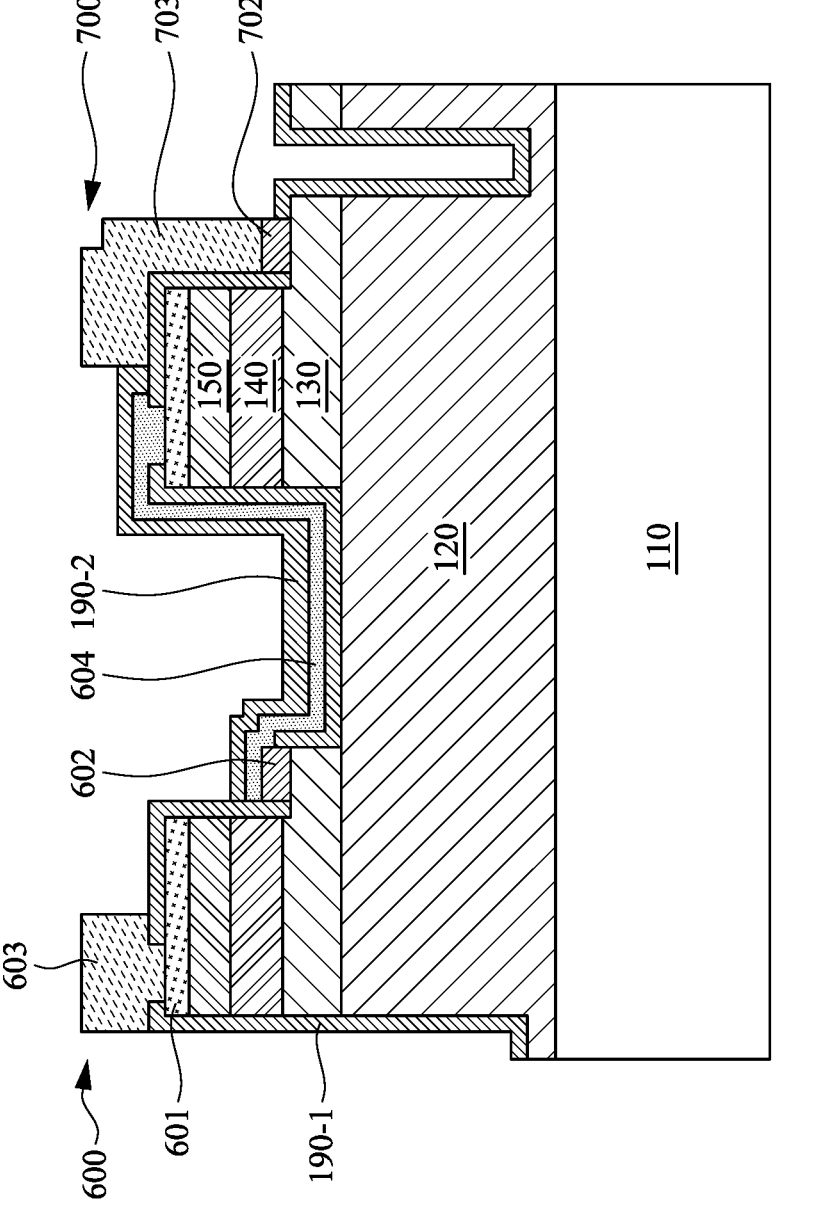

Reference is made to FIG. 25. FIG. 25 shows an intermediate stage after the operation 640 is conducted. The operation 640 includes disposing the metal contact 603 and the metal contact 703. As shown in FIG. 25, the metal contact 603 is electrically connected to the first electrode 601. The metal contact 703 is electrically connected to the second electrode 702. As such, two light-emitting diodes connected in series through the conductive layer 604 are formed, that is, the first electronic component 600 and the second electronic component 700. The first electronic component 600 and the second electronic component 700 share the semiconductor layer 120.

Figure 26:
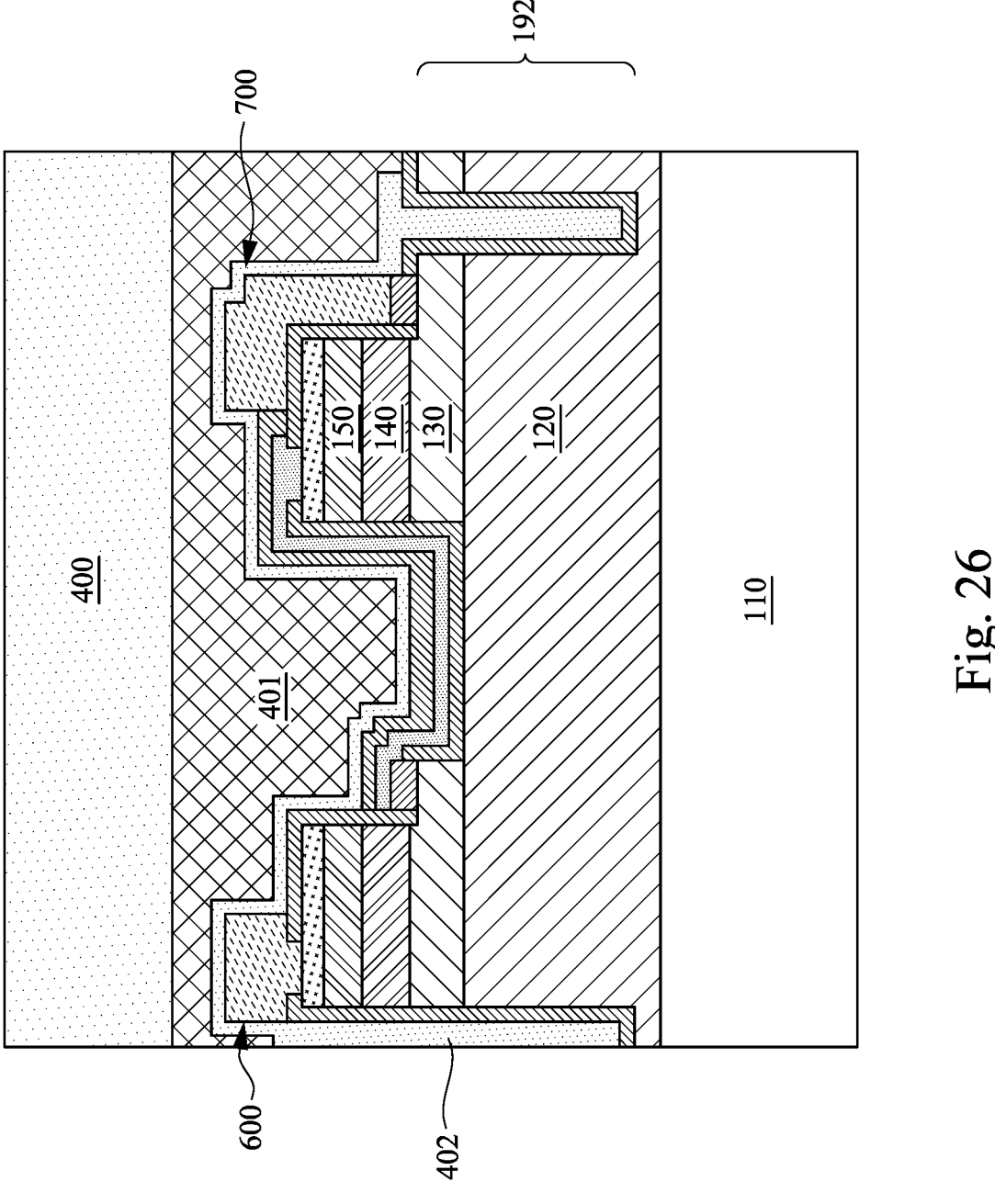

Reference is made to FIG. 26. FIG. 26 shows an intermediate stage after the operation 650 is conducted. The operation 650 includes disposing the sacrificial layer 402 and disposing the bonding layer 401 to bond the first electronic component 600, the second electronic component 700, and the anchor structure 192 to the carrier 400.

Figure 27:
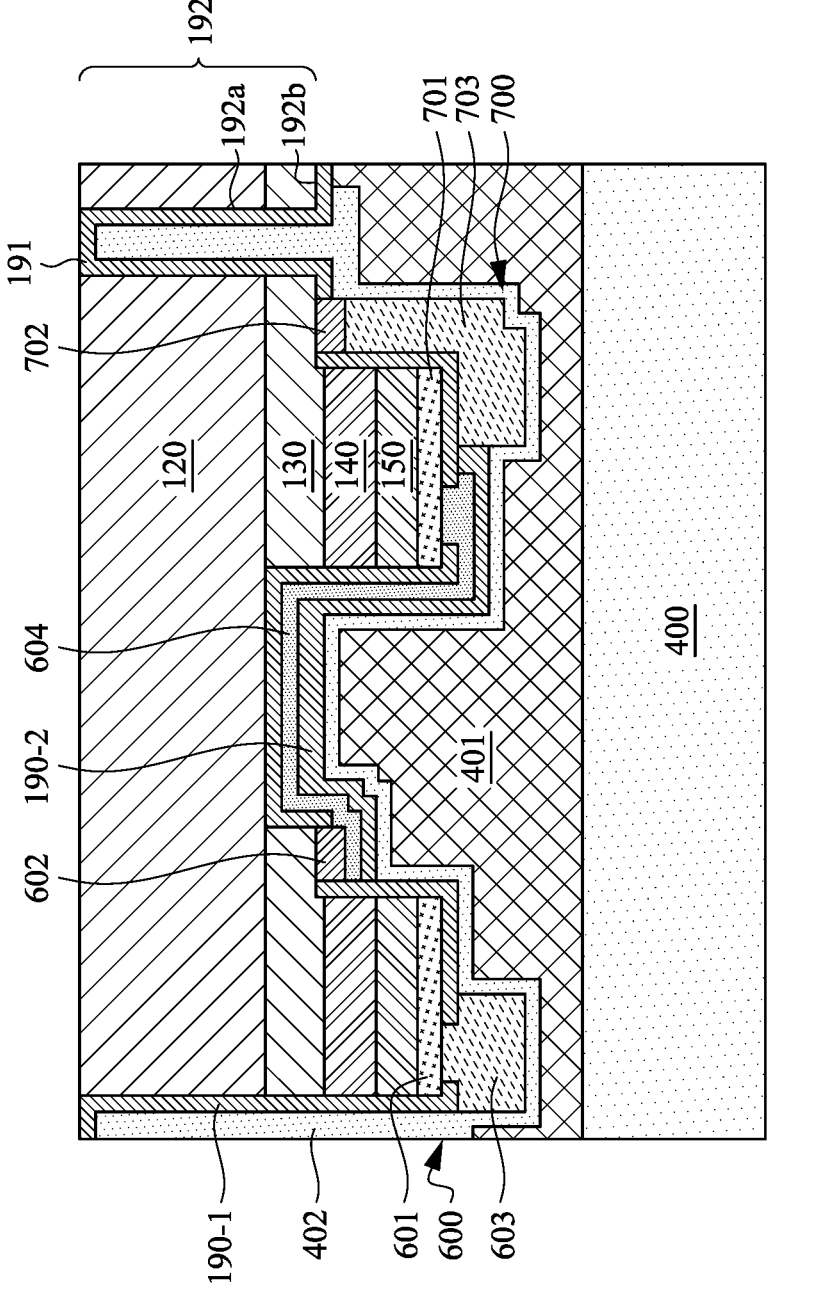

Reference is made to FIG. 27. FIG. 27 shows an intermediate stage after the operation 660 is conducted. The operation 660 includes flipping the resultant intermediate structure upside down and stripping the resultant intermediate structure from the substrate 110, such as through an LLO process. A thinning process follows, then, such as thinning the semiconductor layer 120 down such that a part of the insulating layer 190-1 and the tether 191 are exposed through the semiconductor layer 120.

The intermediate structure resulting from FIG. 27 further undergoes the operation 670. The operation 670 includes removing the sacrificial layer 402, so that the first electronic component 600 and the second electronic component 700 are connected to the bonding layer 401 and the carrier 400 through the tether 191 and the anchor structure 192. The resultant structure after the operation 670 is the light-emitting electronic device 40, as shown in FIG. 17.

The light-emitting electronic device 40 further undergoes the operation 680. The operation 680 includes stripping the first electronic component 600 and the second electronic component 700 from the anchor structure 192, and transferring and electrically connecting the first electronic component 600 and the second electronic component 700 to the circuit substrate 500. To be more specific, the first electrode 601 of the first electronic component 600 is electrically connected to the first bonding pad 501 of the circuit substrate 500 through the metal contact 603. The second electrode 702 of the second electronic component 700 is electrically connected to the second bonding pad 502 of the circuit substrate 500 through the metal contact 703. The resultant intermediate structure after conducting the operation 680 is the light-emitting panel 50, as shown in FIG. 18. In some embodiments, during the stripping process of the first electronic component 600 and the second electronic component 700 from the anchor structure 192, a portion of the tether 191 remains on the sidewall 700b (as shown in FIG. 24) of the second electronic component 700.

Figure 28:
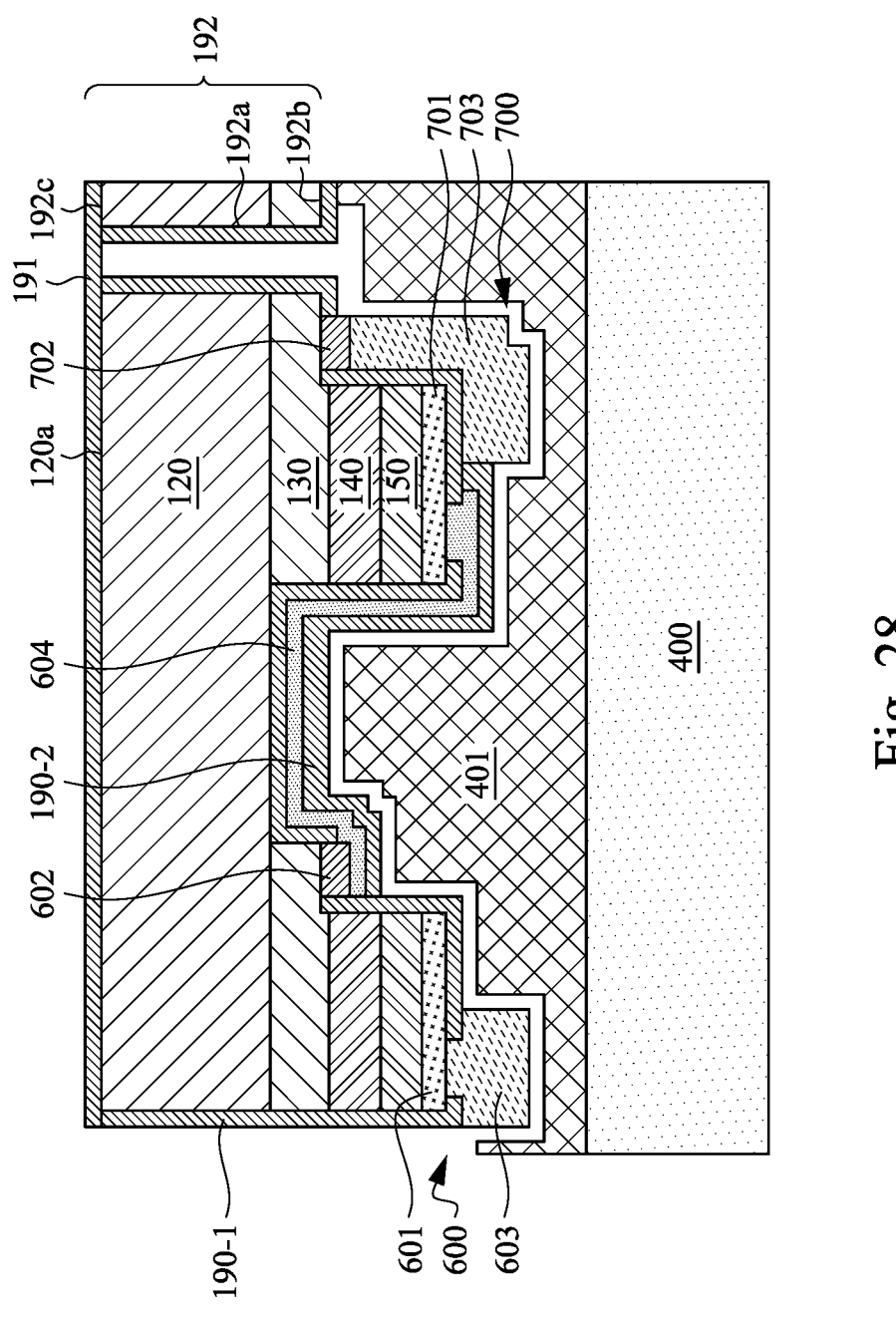
FIG. 28 is a schematic diagram of a light-emitting electronic device according to some other embodiments of the present disclosure.

In some embodiments, the tether 191 connects the surface 120a of the first electronic component 600 and the second electronic component 700 and the surface 192c of the anchor structure 192, as shown in FIG. 28. FIG. 28 is a schematic diagram of a light-emitting electronic device 40' according to some other embodiments of the present disclosure. The first electronic component 600 and the second electronic component 700 are connected to the bonding layer 401 and the carrier 400 through the anchor structure 192 and the tether 191. In the method for manufacturing the light-emitting electronic device 40', the operation 660 may include thinning the semiconductor stacked structure down, so that the anchor structure 192 is separated from the first electronic component 600 and the second electronic component 700. Then, the operation 660 includes forming a tether 191 on the surface 120a and the surface 192c in an additional operation, so that the surface 120a is connected to the surface 192c, and thereby the anchor structure 192 is connected to the first electronic component 600 and the second electronic component 700.

Figure 29:
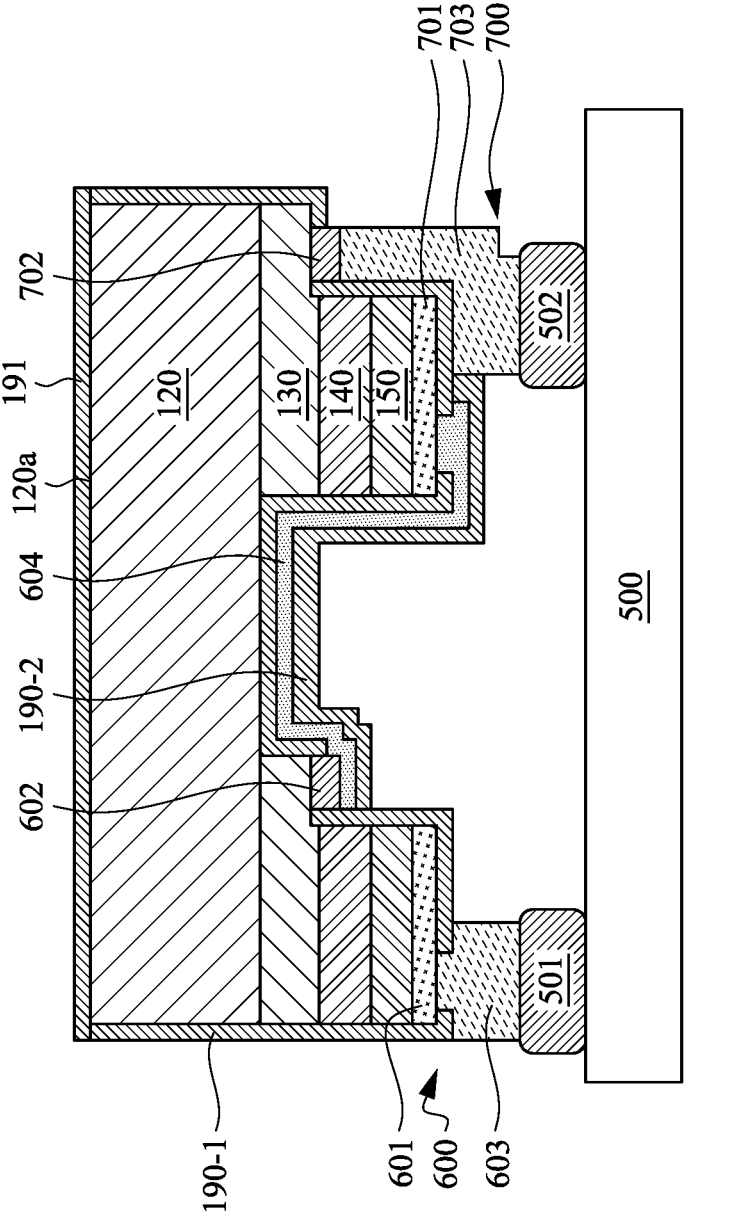
FIG. 29 is a schematic diagram of a light-emitting panel according to some other embodiments of the present disclosure.

Reference is made to FIG. 29. FIG. 29 is a schematic diagram of a light-emitting panel 50' according to some other embodiments of the present disclosure. In some embodiments, corresponding to the light-emitting electronic device 40', the tether 191 of the light-emitting panel 50' is disposed on the surface 120a of the first electronic component 600 or the second electronic component 700.

Figure 30A:
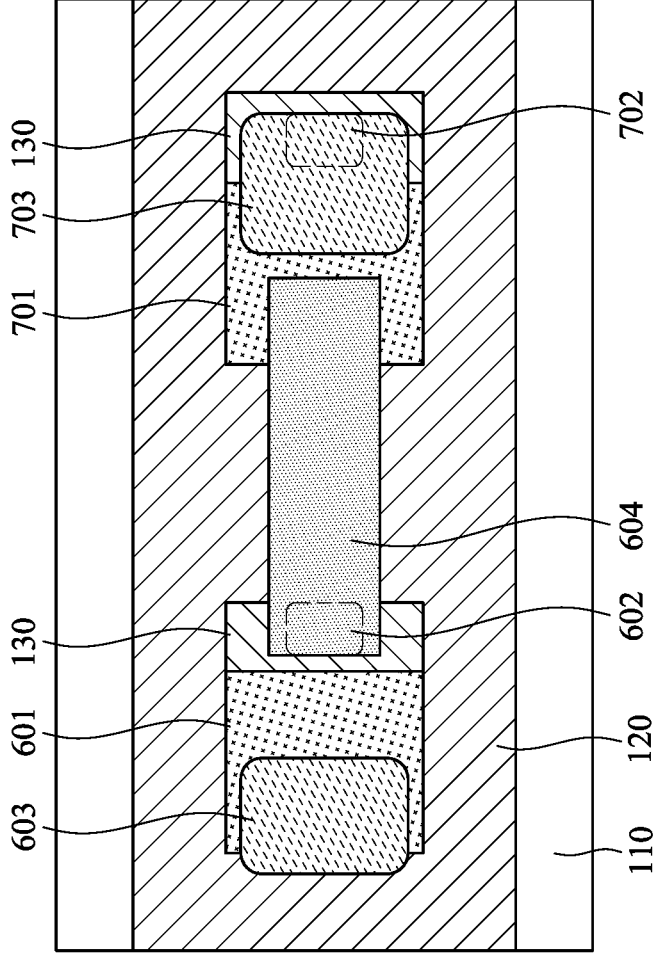
FIG. 30A, FIG. 30B, and FIG. 30C are schematic diagrams for configuration of two light-emitting diodes connected in series according to some embodiments of the present disclosure.

Reference is made to FIG. 30A. FIG. 30A is a schematic diagram for configuration of two light-emitting diodes connected in series according to some embodiments of the present disclosure. FIG. 30A corresponds to a top view of FIG. 25. The insulating layer 190 is omitted in FIG. 30A for clarity. As shown in FIG. 30A, the conductive layer 604 electrically connects the second electrode 602 to the first electrode 701 to connect two light-emitting diodes in series.

Figure 30C:
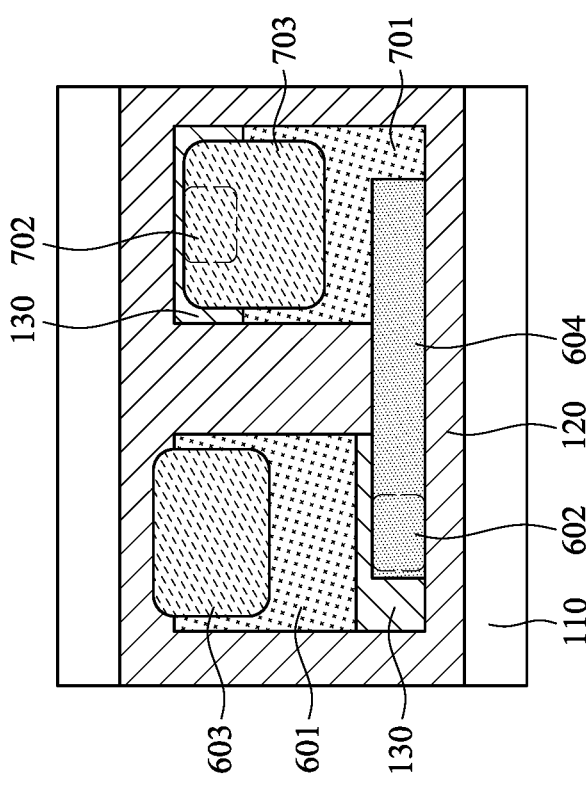
Figure 30B:
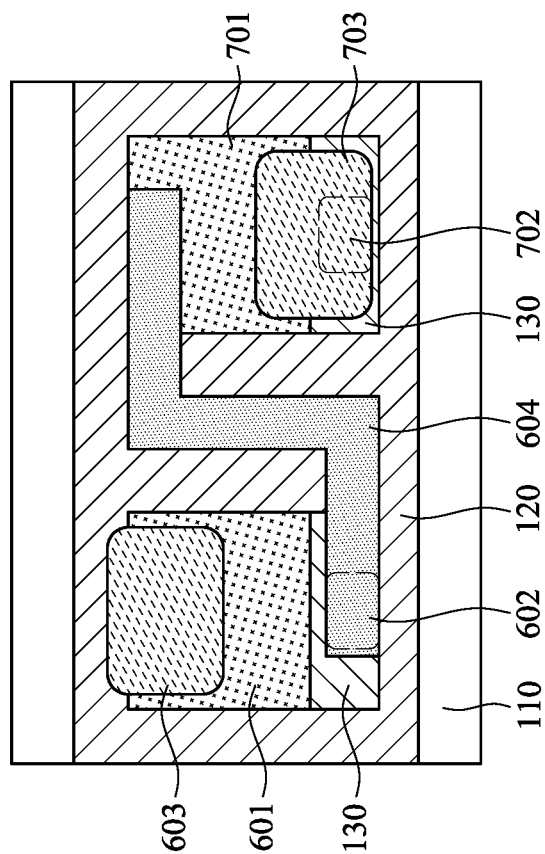

Reference is made to FIG. 30B and FIG. 30C. FIG. 30B and FIG. 30C are schematic diagrams for configuration of two light-emitting diodes connected in series according to some embodiments of the present disclosure. Similarly, the insulating layer 190 is omitted in FIG. 30B and FIG. 30C for clarity. Depending on the semiconductor stacked structure and the etching patterns of the mesa etching processes, the two light-emitting diodes may have different orientations. Therefore, the way of connection of the conductive layer 604 may differ. As shown in FIG. 30B, two light-emitting diodes are juxtaposed and the second electrode 602 is adjacent to the second electrode 702, so the conductive layer 604 is Z-shaped to electrically connect the second electrode 602 to the first electrode 701. In FIG. 30C, two light-emitting diodes are juxtaposed and the second electrode 602 is adjacent to the first electrode 701, so the conductive layer 604 is in a straight line to electrically connect the second electrode 602 to the first electrode 701.

Figure 31A:
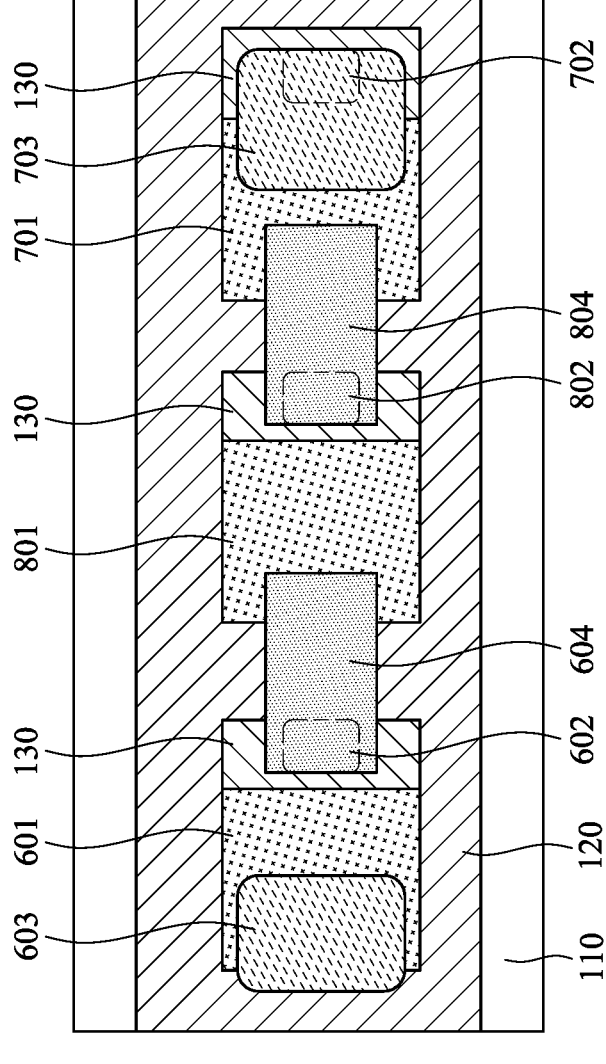
FIG. 31A, FIG. 31B, and FIG. 31C are schematic diagrams for configuration of three light-emitting diodes connected in series according to some embodiments of the present disclosure.
Figure 31B:
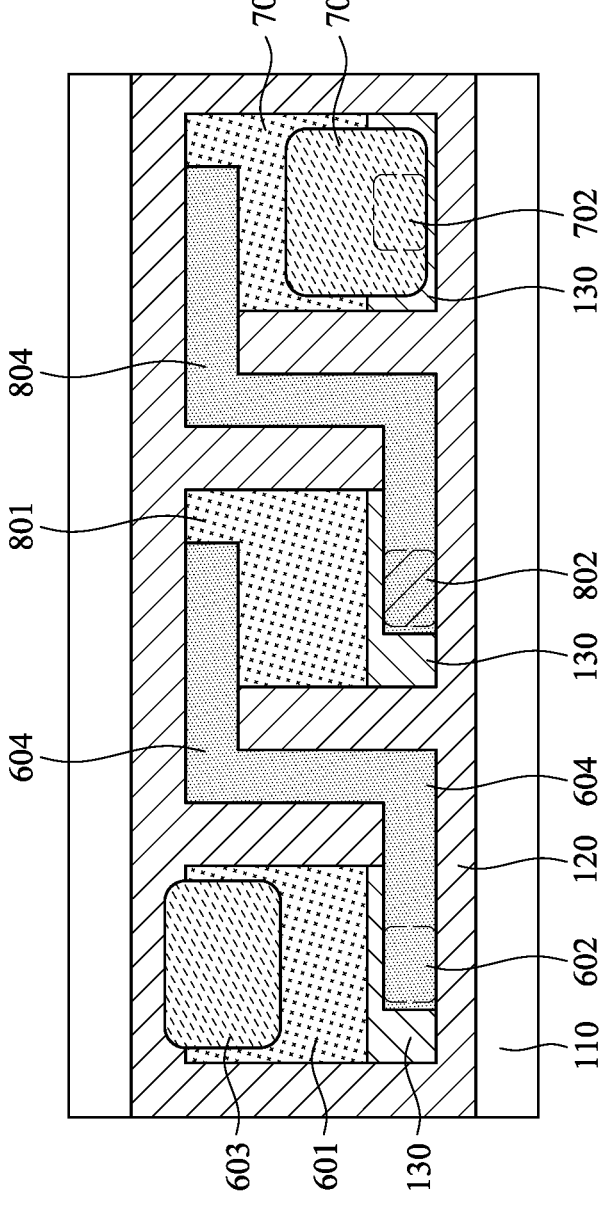
Figure 31C:
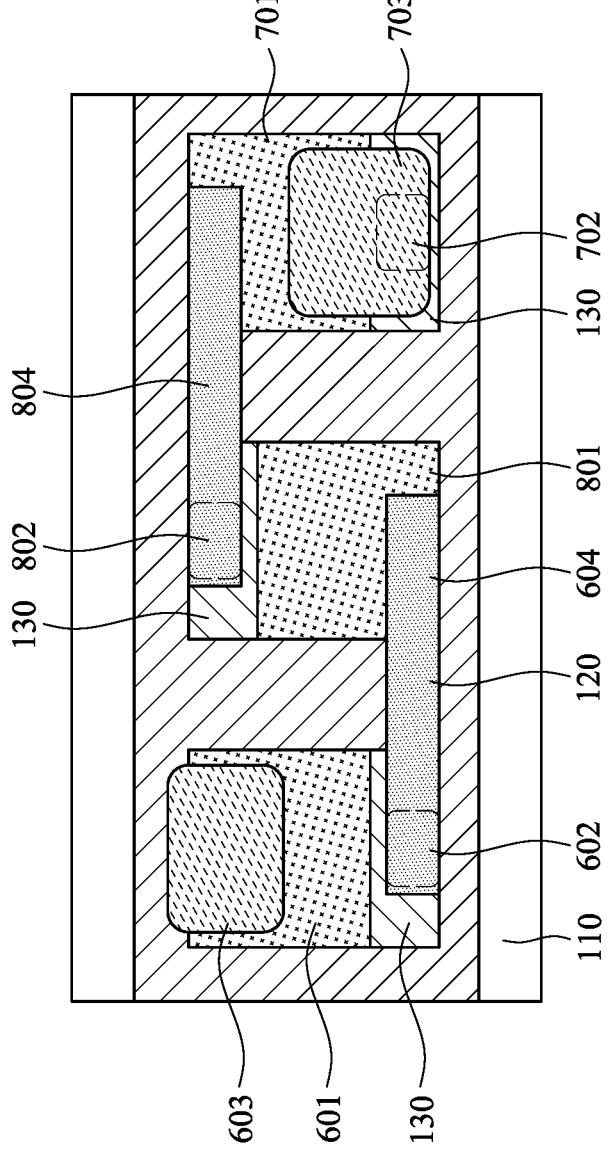

Reference is made to FIG. 31A, FIG. 31B, and FIG. 31C. FIG. 31A, FIG. 31B, and FIG. 31C are schematic diagrams for configuration of three light-emitting diodes according to some embodiments of the present disclosure. Similarly, the insulating layer 190 is omitted in FIG. 31A, FIG. 31B, and FIG. 31C for clarity. As shown in FIG. 31A, the conductive layer 604 electrically connects the second electrode 602 to the first electrode 801. The conductive layer 804 electrically connects the second electrode 802 to the first electrode 701 to connect three light-emitting diodes in series. FIG. 31B and FIG. 31C are similar to FIG. 30B and FIG. 30C, respectively. Since the light-emitting diodes have different orientations (for example, three light-emitting diodes are juxtaposed here), the way of connection between the conductive layer 604 and the conductive layer 804 correspondingly differs.

Reference is made to FIG. 32A, FIG. 32B, FIG. 32C and FIG. 32D. FIG. 32A, FIG. 32B, FIG. 32C and FIG. 32D are schematic diagrams for configuration of the tether 191 and

Figure 32A:
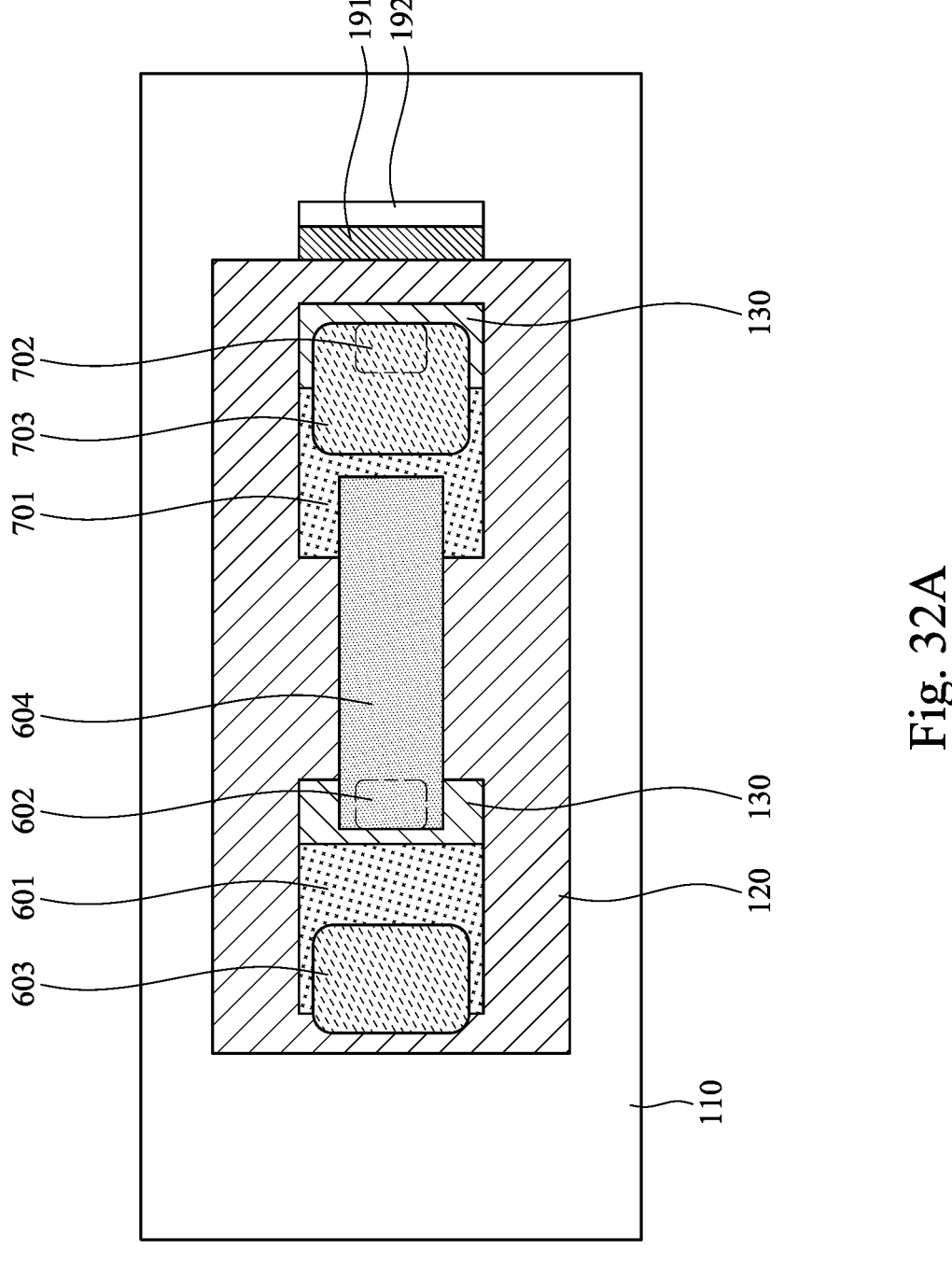
FIG. 32A, FIG. 32B, FIG. 32C, FIG. 32D, FIG. 32E, and FIG. 32F are schematic diagrams for configuration of tethers and anchor structures according to some embodiments of the present disclosure.
Figure 32B:
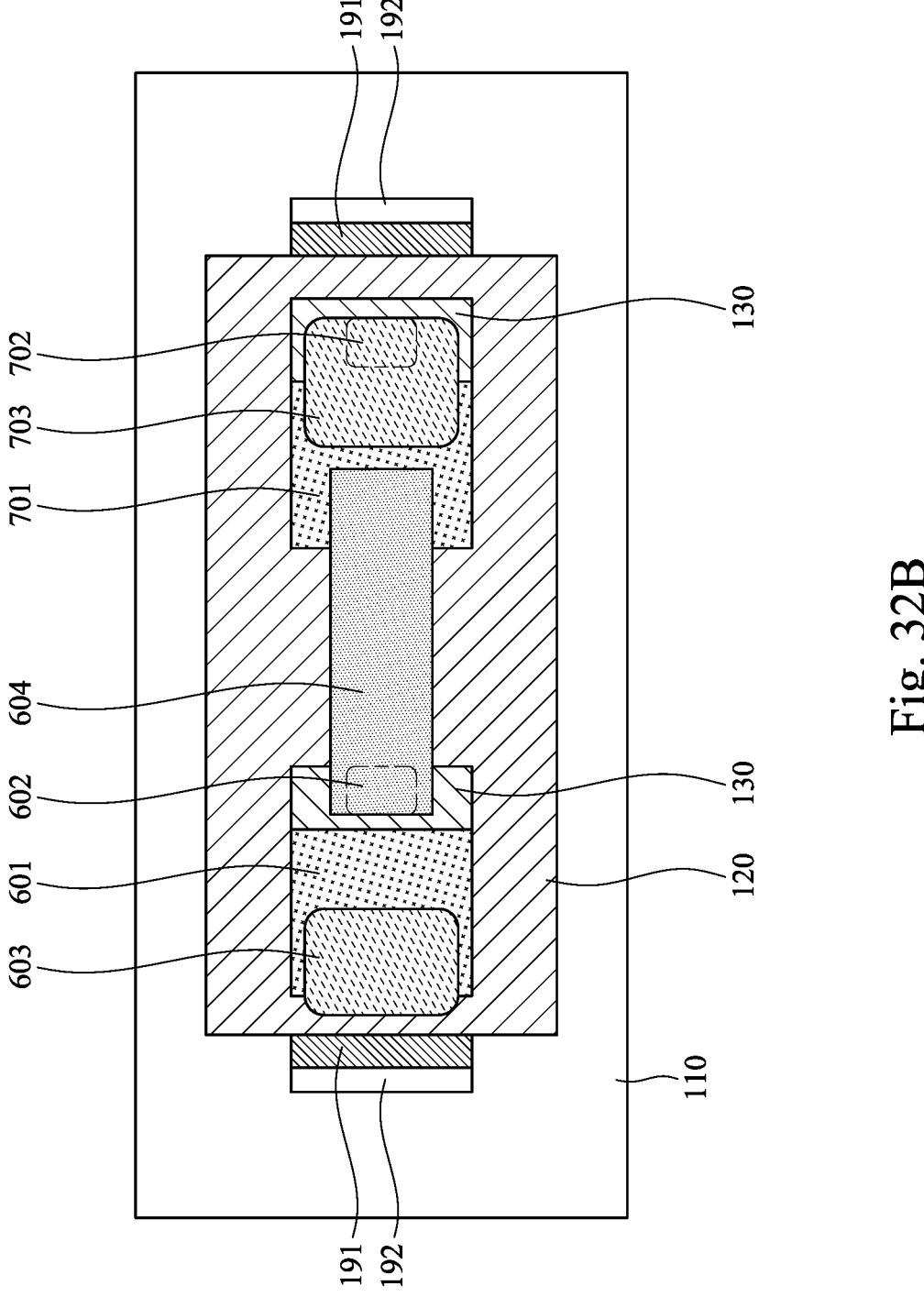

17 the anchor structure 192 according to some embodiments of the present disclosure. The tether 191 and the anchor structure 192 may have different configurations depending on their desired bonding strengths with the carrier 400. For example, the configuration of the tether 191 and the anchor structure 192 in FIG. 32A is the same as that in FIG. 25. That is, the tether 191 and the anchor structure 192 are disposed laterally on a side of the second electronic component 700 close to the second electrode 702. In FIG. 32B, one tether 191 and one anchor structure 192 are shown to be disposed laterally on a side of the first electronic component 600 close to the first electrode 601. The other tether 191 and the other anchor structure 192 are shown to be disposed laterally on a side of the second electronic component 700 close to the second electrode 702.

Figure 32C:
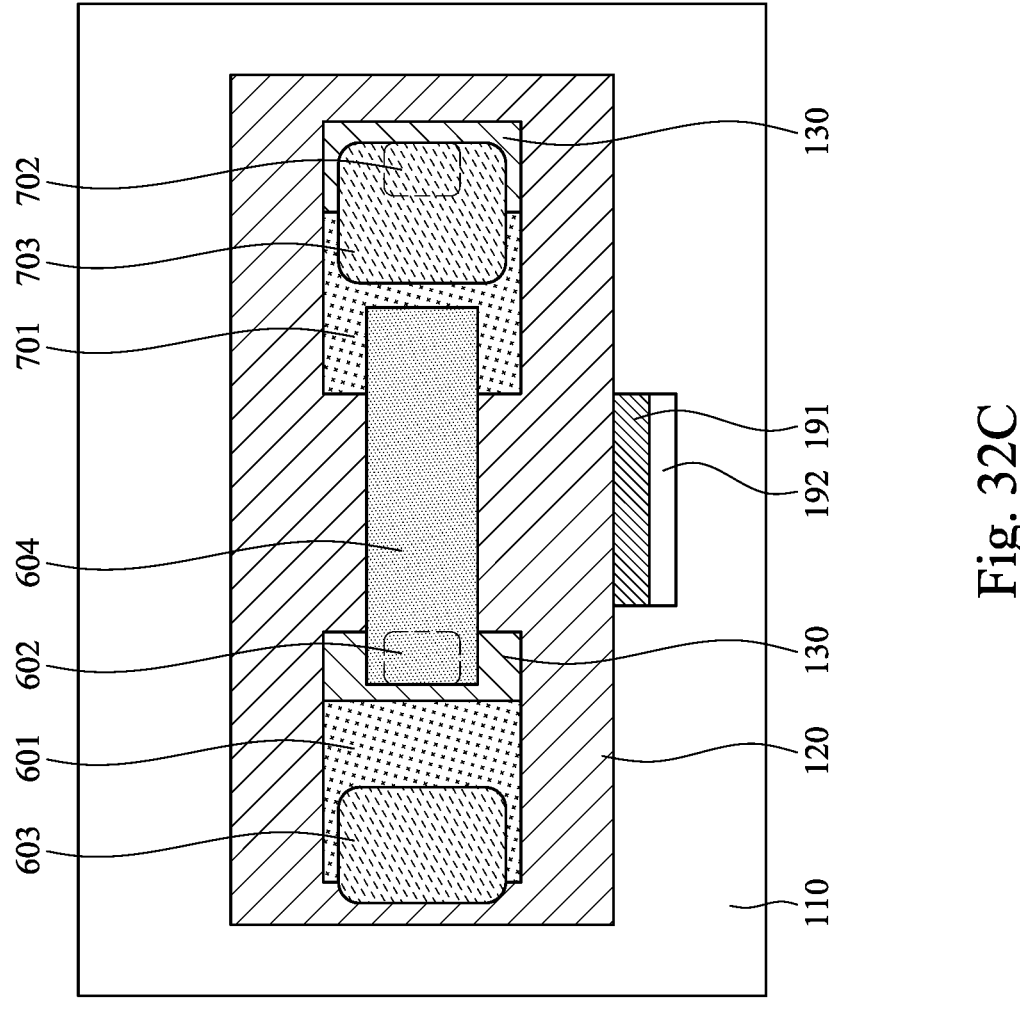
Figure 32D:
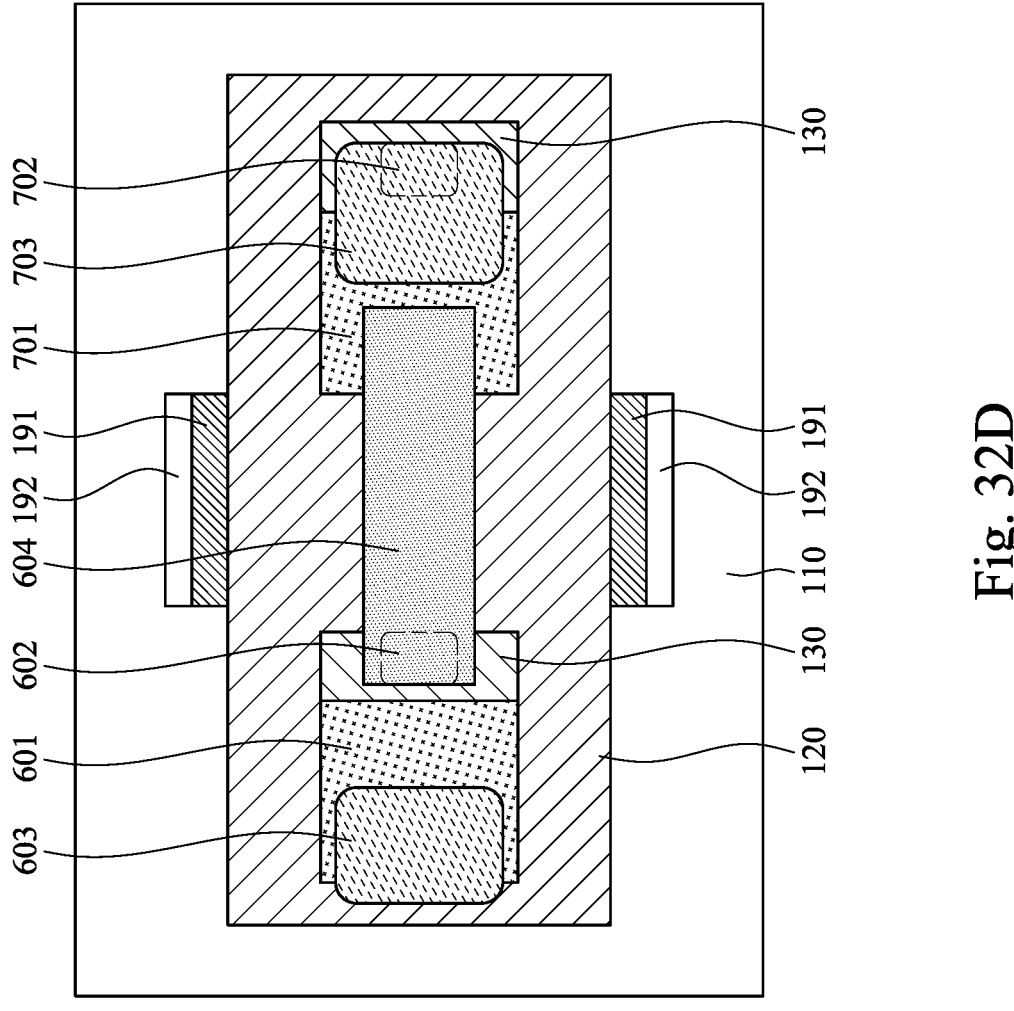

In some embodiments, as shown in FIG. 32C, the tether 191 and the anchor structure 192 are disposed on the outer side of the conductive layer 604. In FIG. 32D, two tethers 191 and two anchor structures 192 are disposed on two opposite sides of the conductive layer 604.

Figure 32E:
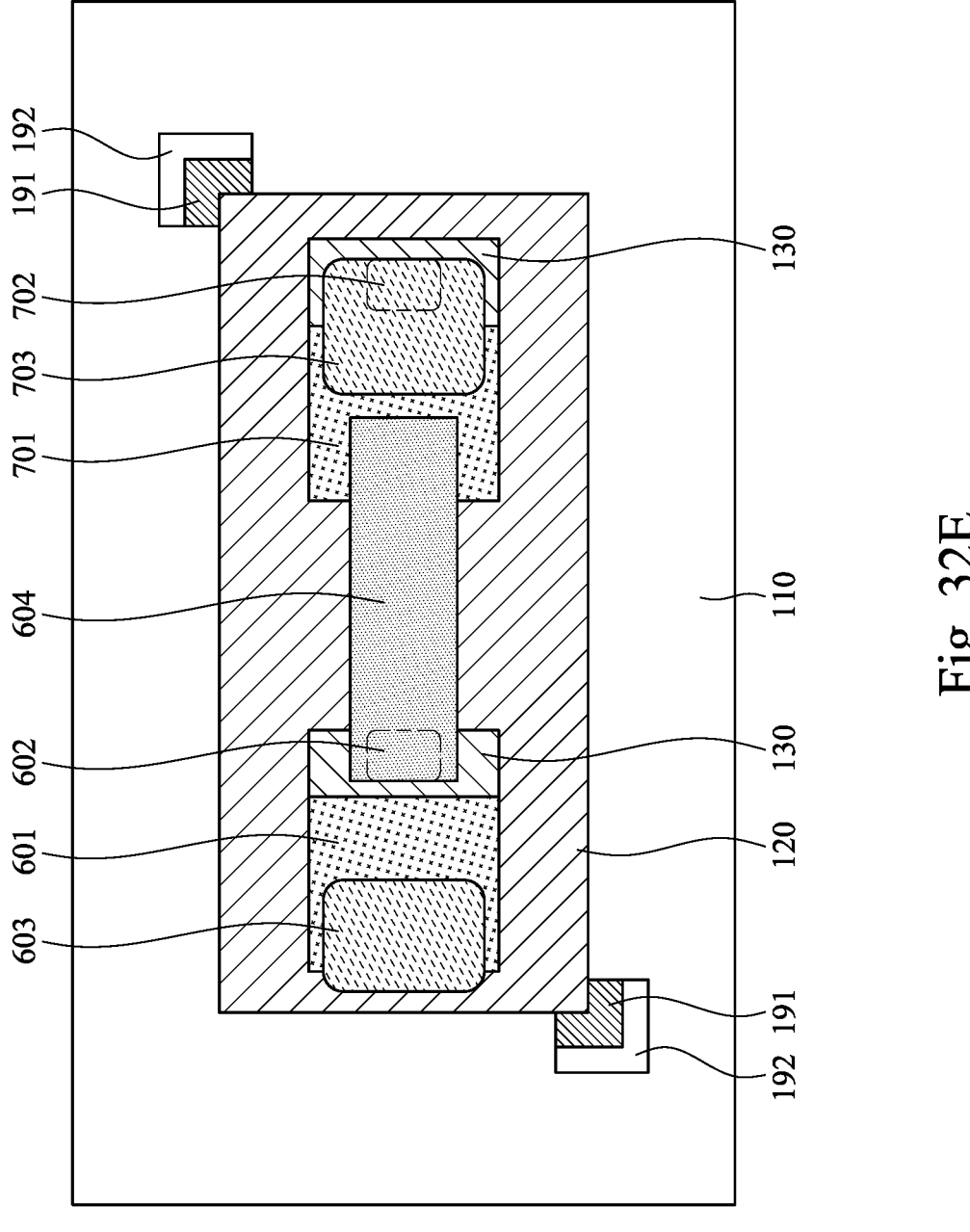
Figure 32F:
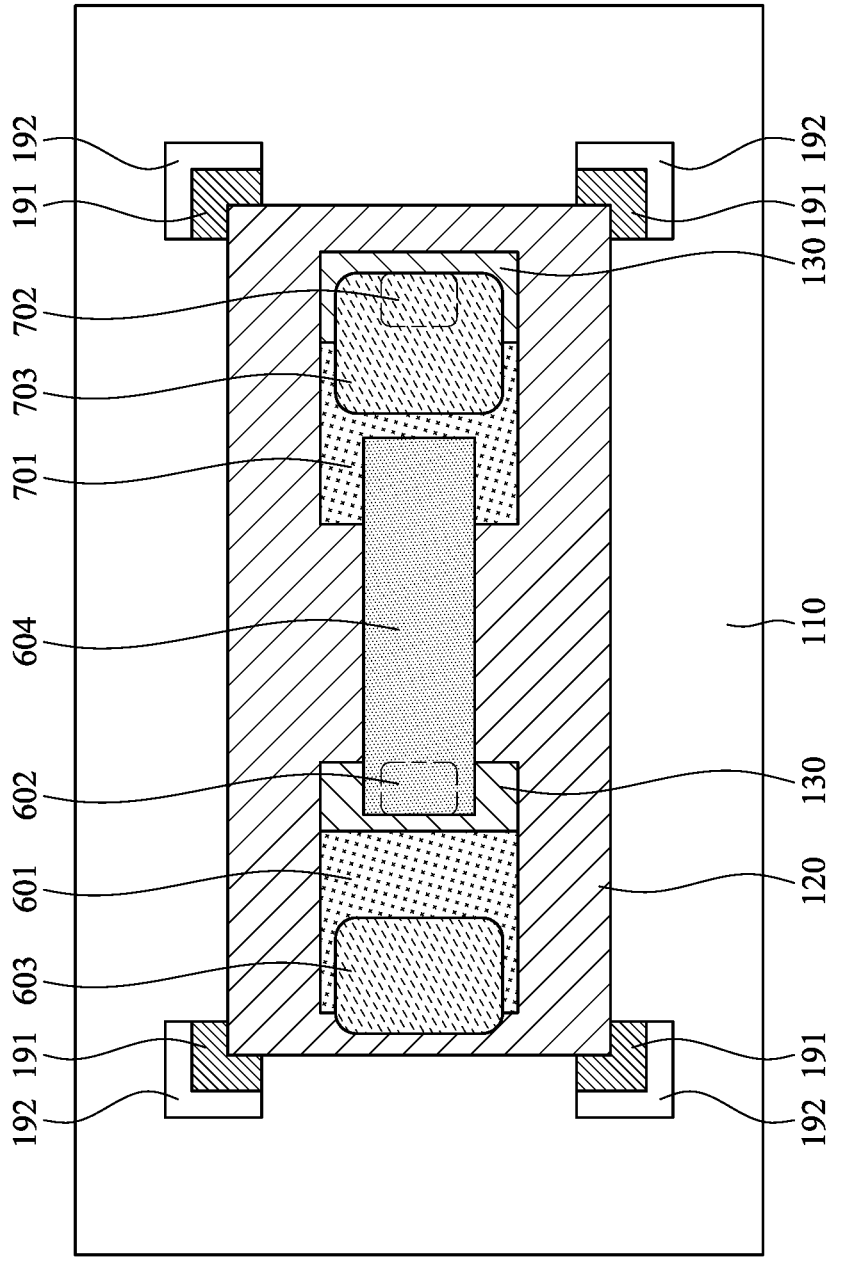

In some embodiments, the tether 191 and the anchor structure 192 are L-shaped. The anchor structure 192 laterally and partially surrounds the tether 191. The anchor structure 192 and the tether 191 are disposed around a corner of the semiconductor layer 120 together. As shown in FIG. 32E, two tethers 191 and two anchor structures 192 are disposed at two opposite corners of the semiconductor layer 120. In FIG. 32F, four tethers 191 and four anchor structures 192 are disposed at four corners of the semiconductor layer 120.

According to the foregoing recitations of the embodiments of the disclosure, it may be seen that in the light-emitting electronic devices and light-emitting panels of some embodiments of the present disclosure, by integrating a light-emitting element and a driving element onto a semiconductor layer such as an undoped gallium nitride layer, the circuit may be simplified. Also, the light-emitting element and the driving element may be in turn disposed on the same side of the semiconductor layer, thereby increasing pixel density. Moreover, by integrating two light-emitting elements onto a semiconductor layer and connecting them in series, the circuit may be simplified and the spacing between the two light-emitting elements may be reduced. Furthermore, the total current of the light-emitting panel may be reduced while the driving voltage of the array substrate remains unchanged. This may reduce power consumption of the light-emitting panel. Meanwhile, the integrated light-emitting electronic device may reduce the number of mass transfers to be conducted and diminish defects that may be caused by complex circuits. Therefore, yield rates may be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

18

What is claimed is:

1. A light-emitting electronic device, comprising:
a first electronic component comprising a plurality of semiconductor layers vertically stacked together, a first electrode, and a second electrode;
a second electronic component comprising a plurality of semiconductor layers vertically stacked together, a first electrode, and a second electrode;
an insulating layer extending along a lower surface and a plurality of sidewalls of the first electronic component and along a lower surface and a plurality of sidewalls of the second electronic component;
a conductive layer at least partially disposed in the insulating layer and electrically connected to the second electrode of the first electronic component and the first electrode of the second electronic component;
an anchor structure laterally separated from the first electronic component and the second electronic component, the anchor structure comprising a plurality of semiconductor layers vertically stacked together; and
a tether connected to the first electronic component, the second electronic component, and the anchor structure.

2. The light-emitting electronic device of claim 1, wherein the first electronic component and the second electronic component have a continuous undoped semiconductor layer.

3. The light-emitting electronic device of claim 1, wherein the first electronic component is a light-emitting diode, the plurality of semiconductor layers of the first electronic component comprising a first semiconductor layer, a second semiconductor layer, and an active layer disposed between the first semiconductor layer and the second semiconductor layer, the first electrode of the first electronic component is electrically connected to the first semiconductor layer of the first electronic component, and the second electrode of the first electronic component is electrically connected to the second semiconductor layer of the first electronic component.

4. The light-emitting electronic device of claim 3, wherein the second electronic component is a light-emitting diode, the plurality of semiconductor layers of the second electronic component comprising a first semiconductor layer, a second semiconductor layer, and an active layer disposed between the first semiconductor layer and the second semiconductor layer, the first electrode of the second electronic component is electrically connected to the first semiconductor layer of the second electronic component, and the second electrode of the second electronic component is electrically connected to the second semiconductor layer of the second electronic component.

5. The light-emitting electronic device of claim 4, wherein the first semiconductor layer of the first electronic component and the first semiconductor layer of the second electronic component comprise one of an n-type semiconductor and a p-type semiconductor, and the second semiconductor layer of the first electronic component and the second semiconductor layer of the second electronic component comprise the other of the n-type semiconductor and the p-type semiconductor.

6. The light-emitting electronic device of claim 3, wherein the second electronic component is a driving element.

7. The light-emitting electronic device of claim 6, wherein the driving element is a high electron mobility transistor, the second electronic component further comprises a third electrode electrically connected to one of the plurality of semiconductor layers of the second electronic component, the first electrode of the second electronic component is one of a source and a drain, the second electrode of the second electronic component is the other of the source and the drain, and the third electrode is a gate.

8. The light-emitting electronic device of claim 6, wherein the first semiconductor layer comprises one of an n-type semiconductor and a p-type semiconductor, and the second semiconductor layer comprises the other of the n-type semiconductor and the p-type semiconductor.

9. The light-emitting electronic device of claim 1, wherein the tether is a portion extending from the insulating layer and is connected to the anchor structure.

10. The light-emitting electronic device of claim 1, wherein the tether connects a top surface of the first electronic component, a top surface of the second electronic component, and a top surface of the anchor structure.

\* \* \* \* \*